United States Patent
Zhang et al.

(10) Patent No.: US 11,640,796 B2
(45) Date of Patent: *May 2, 2023

(54) OUTPUT CONTROL DEVICE, OUTPUT CONTROL CIRCUIT, DISPLAY PANEL, AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Mengmeng Zhang, Shanghai (CN); Yana Gao, Shanghai (CN); Xingyao Zhou, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/810,612

(22) Filed: Jul. 4, 2022

(65) Prior Publication Data

US 2022/0335901 A1 Oct. 20, 2022

Related U.S. Application Data

(63) Continuation of application No. 16/997,937, filed on Aug. 20, 2020, now Pat. No. 11,410,609.

(30) Foreign Application Priority Data

Jun. 30, 2020 (CN) .......................... 202010614254.8

(51) Int. Cl.
*G09G 3/3266* (2016.01)
*G09G 3/3225* (2016.01)

(52) U.S. Cl.
CPC ......... *G09G 3/3266* (2013.01); *G09G 3/3225* (2013.01); *G09G 2300/0426* (2013.01);
(Continued)

(58) Field of Classification Search
CPC ... G09G 2310/0286; G09G 2320/0247; G09G 2320/0238; G09G 2340/0435
See application file for complete search history.

(56) References Cited

U.S. PATENT DOCUMENTS 10,937,370 B2 * 3/2021 Son ........................ G09G 3/006
10,957,755 B2 * 3/2021 Han ...................... H01L 27/3262
(Continued)

FOREIGN PATENT DOCUMENTS

CN 205282054 U 6/2016
CN 106486065 A 3/2017
(Continued)

OTHER PUBLICATIONS

Office Action of CN Patent Application No. 202010614254.8.

*Primary Examiner* — Sepehr Azari
(74) *Attorney, Agent, or Firm* — Kilpatrick Townsend & Stockton, LLP

(57) ABSTRACT

Provided is an output control device for providing control signals for a pixel circuit, which includes: a first output device configured to output a first control signal for controlling writing of a data signal into the pixel circuit, and a third output device configured to output a third control signal for controlling resetting of the light emitting element. A frequency of the third control signal is higher than a frequency of the first control signal.

22 Claims, 13 Drawing Sheets

(52) U.S. Cl.
CPC . *G09G 2310/0286* (2013.01); *G09G 2310/08* (2013.01); *G09G 2320/0247* (2013.01)

(56) References Cited

U.S. PATENT DOCUMENTS

| | | | |
|---|---|---|---|
| 11,227,550 B2* | 1/2022 | Feng | G09G 3/3266 |
| 2011/0148826 A1* | 6/2011 | Koyama | G09G 3/3618 |
| | | | 345/204 |
| 2011/0267297 A1* | 11/2011 | Yamazaki | G02F 1/13338 |
| | | | 345/82 |
| 2011/0285675 A1* | 11/2011 | Amano | G11C 19/28 |
| | | | 377/64 |
| 2015/0015554 A1* | 1/2015 | Kim | G09G 3/3266 |
| | | | 345/208 |
| 2017/0004775 A1* | 1/2017 | Chen | G11C 19/28 |
| 2017/0206824 A1* | 7/2017 | Sun | G09G 3/3266 |
| 2018/0113564 A1* | 4/2018 | Takahashi | G06F 3/0446 |
| 2018/0277037 A1* | 9/2018 | Lin | G09G 3/325 |
| 2019/0035322 A1* | 1/2019 | Kim | G09G 3/3233 |
| 2019/0180834 A1* | 6/2019 | Yuan | G09G 3/3677 |
| 2019/0333596 A1* | 10/2019 | Zhu | G11C 19/287 |
| 2020/0312234 A1* | 10/2020 | Lin | G09G 3/3275 |
| 2021/0027696 A1* | 1/2021 | Kim | G09G 3/32 |
| 2021/0049959 A1* | 2/2021 | Park | G09G 3/325 |

FOREIGN PATENT DOCUMENTS

| | | |
|---|---|---|
| CN | 108573734 A | 9/2018 |
| CN | 110352453 A | 10/2019 |
| CN | 110797070 A | 2/2020 |
| CN | 111199711 A | 5/2020 |
| CN | 111223433 A | 6/2020 |

* cited by examiner

OUTPUT CONTROL DEVICE, OUTPUT CONTROL CIRCUIT, DISPLAY PANEL, AND DISPLAY DEVICE

CROSS-REFERENCE TO RELATED APPLICATIONS

This application is a continuation of U.S. patent application Ser. No. 16/997,937, filed on Aug. 20, 2020, which claims priority to Chinese Patent Application No. 202010614254.8, filed on Jun. 30, 2020. All of the aforementioned patent applications are hereby incorporated by reference in their entireties.

FIELD

The present disclosure relates to the field of display technology, and more particularly, to an output control device, an output control circuit, a display panel, and a display device.

BACKGROUND

In the current Organic Light Emitting Display (OLED) technology, when a pixel circuit drives an organic light emitting device to emit light, the frequency of data writing is the same as the frequency of resetting an anode of the light emitting device. When the anode of the light emitting device is being reset, the light emitting device does not emit light and displays a black frame, known as black frame insertion. When the display is driven at a low frequency, the frequency of resetting the anode of the light emitting device is also low and the black frame insertion for the light emitting device can be easily recognized by human eyes, resulting in display flickers that affect users' visual experience.

SUMMARY

The embodiments of the present disclosure provide an output control device, an output control circuit and a display panel, solves the problem of display flickers at low driving frequencies.

In a first aspect, an output control device for providing control signals for a pixel circuit is provided according to an embodiment of the present disclosure. The output control device includes a first output device configured to output a first control signal for controlling writing of a data signal into the pixel circuit, and a third output device configured to output a third control signal for controlling resetting of a light emitting element. A frequency of the third control signal is higher than a frequency of the first control signal.

In a second aspect, an output control circuit is provided based on the same inventive concept according to an embodiment of the present disclosure. The output control device includes the output control device provided in the first aspect, and also includes a second output device configured to output a second control signal for controlling the light emitting element to emit light. The output control device includes a scan control driving circuit and a light emission control driving circuit. The scan control driving circuit includes the first output device and the third output device, and the light emission control driving circuit includes the second output device. The output control circuit includes a plurality of stages of output control devices. A start scan shift signal is inputted at an input terminal of the scan control driving circuit in the output control device at the first stage, and a start light emission shift signal is inputted at an input terminal of the light emission control driving circuit in the output control device at the first stage. The input terminal of the scan control driving circuit in the output control device at the n-th stage is electrically connected to the output terminal of the third output device of the scan control driving circuit in the output control device at the (n−1)-th stage, and the input terminal of the light emission control driving circuit in the output control device at the n-th stage is electrically connected to the output terminal of the second output device of the light emission control driving circuit in the output control device at the (n−1)-th stage, where n is a positive integer and n≥2.

In a third aspect, a display panel is provided based on the same inventive concept according to an embodiment of the present disclosure. The display panel includes the output control circuit provided in the second aspect; and a plurality of pixel circuits arranged in an array. Each pixel circuit includes a first resetting device, a second resetting device, a data writing device, a light emission control device, a driving transistor, and a light emitting element. The first resetting device is configured to reset a gate of the driving transistor, the second resetting device is configured to reset the light emitting element, the data writing device is configured to write a data signal, and the light emission control device is configured to control the light emitting element to emit light. In one of the plurality of pixel circuits: a control terminal of the first resetting device is electrically connected to the third output device of the scan control driving circuit in the output control device at the (m−1)-th stage, where m is a positive integer, and m≥2; a control terminal of the second resetting device is electrically connected to the third output device of the scan control driving circuit in the output control device at the m-th stage; a control terminal of the data writing device is electrically connected to the first output device of the scan control driving circuit in the output control device at the m-th stage; and a control terminal of the light emission control device is electrically connected to the second output device of the light emission control driving circuit in the output control device at the m-th stage.

In a fourth aspect, an output control circuit is provided based on the same inventive concept according to another embodiment of the present disclosure. The output control circuit includes a plurality of stages of output control devices. Each of the plurality of stages of output control devices is the output control device provided in the first aspect. The output control device also includes a second output device configured to output a second control signal for controlling the light emitting element to emit light. The output control device includes a scan control driving circuit and a light emission control driving circuit. The light emission control driving circuit includes the second output device and the third output device. The scan control driving circuit includes the first output device. The output control circuit includes a plurality of stages of output control devices. A start scan shift signal is inputted at an input terminal of the scan control driving circuit in the output control device at the first stage, and a start light emission shift signal is inputted at an input terminal of the light emission control driving circuit in the output control device at the first stage. The input terminal of the scan control driving circuit in the output control device at the n-th stage is electrically connected to the output terminal of the first output device of the scan control driving circuit in the output control device at the (n−1)-th stage, and the input terminal of the light emission control driving circuit in the output control device at the n-th stage is electrically connected to the output terminal of the second output device of the light emission control driving circuit in the output control device at the (n−1)-th stage, where n is a positive integer and n≥2.

In a fifth aspect, a display panel is provided based on the same inventive concept according to an embodiment of the present disclosure and includes the output control circuit provided in the fourth aspect. The display panel includes the above output control circuit; and a plurality of pixel circuits arranged in an array. Each pixel circuit includes a first resetting device, a second resetting device, a data writing device, a light emission control device, a driving transistor, and a light emitting element. The first resetting device is configured to reset a gate of the driving transistor, the second resetting device is configured to reset the light emitting element, the data writing device is configured to write a data signal, and the light emission control device is configured to control the light emitting element to emit light. In one of the pixel circuits: a control terminal of the first resetting device is electrically connected to the first output device of the scan control driving circuit in the output control device at the (m−1)-th stage, where m is a positive integer, and m≥2; a control terminal of the second resetting device is electrically connected to the third output device of the light emission control driving circuit in the output control device at the m-th stage; a control terminal of the data writing device is electrically connected to the first output device of the scan control driving circuit in the output control device at the m-th stage; and a control terminal of the light emission control device is electrically connected to the second output device of the light emission control driving circuit in the output control device at the m-th stage.

In a sixth aspect, a display device is provided and includes the display panel provided in the third aspect.

In a seventh aspect, a display device is provided and includes the display panel provided in the fifth aspect.

The output control device, the output control circuit, the display panel, and the display device according to the embodiments of the present disclosure have the following advantageous effects. The output control device according to the embodiment of the present disclosure can provide at least two types of control signals for a pixel circuit: a first control signal for controlling writing of a data signal into the pixel circuit, and a third control signal for controlling resetting of the light emitting element. The frequency of the third control signal is higher than the frequency of the first control signal, and the light emitting element can be reset at a high frequency while the data signal can be written at a low frequency, solving the problem of display flickers at low frequencies.

BRIEF DESCRIPTION OF DRAWINGS

In order to explain the embodiments of the present disclosure more clearly, the drawings used in the description of the embodiments will be briefly introduced in the following. The drawings in the following description are only some of the embodiments of the present disclosure.

DESCRIPTION OF EMBODIMENTS

The embodiments of the present disclosure will be described clearly and completely below with reference to the accompanying drawings in the embodiments of the present disclosure will become more apparent. The described embodiments are some of the embodiments of the present disclosure, but not all the embodiments.

The terms used in the embodiments of the present disclosure are only for the purpose of describing the specific embodiments, rather than limiting the present disclosure. The singular forms of "a", "an" and "the" used in the embodiments of the present disclosure and the attached claims are intended to include plural forms as well, unless indicated otherwise explicitly in the context.

Figure 1:
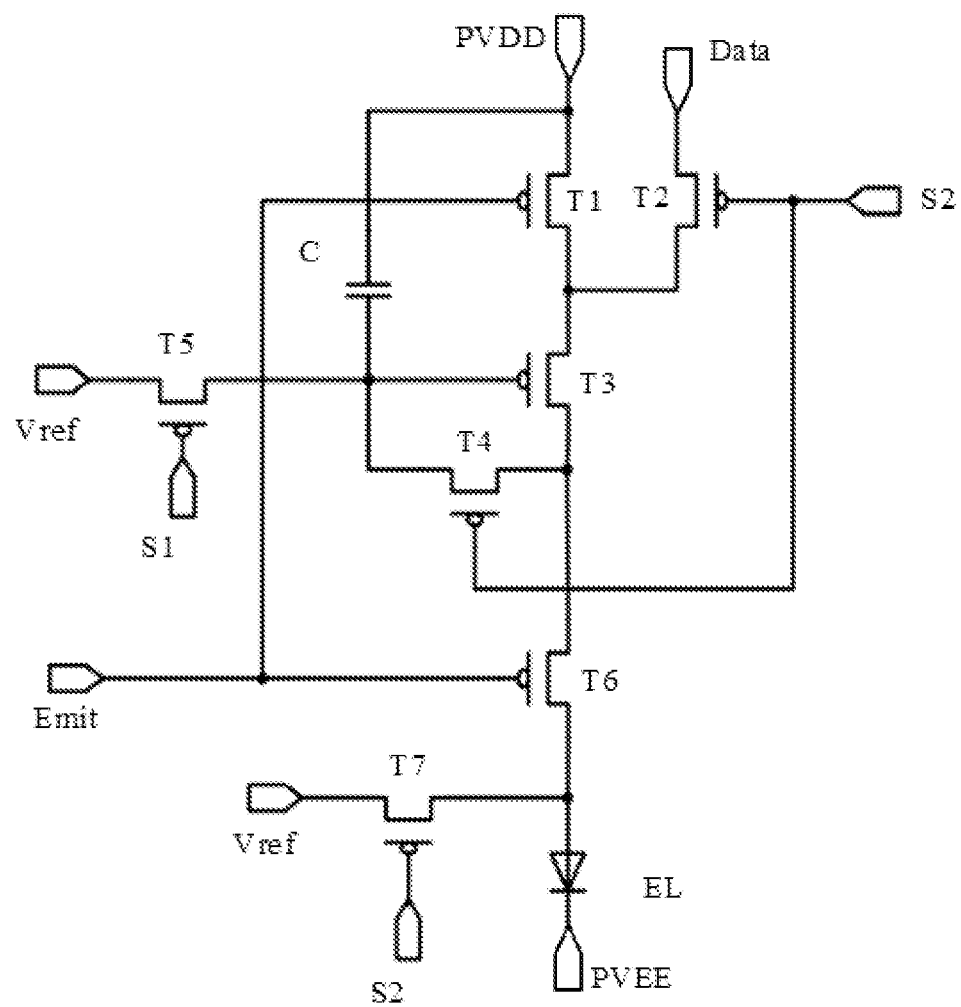
FIG. 1 is a schematic diagram of a pixel circuit.

FIG. 1 is a schematic diagram of a pixel circuit. As shown in FIG. 1, the pixel circuit is connected to a light emitting device EL. Taking a 7T1C pixel circuit as an example, the figure shows various signal terminals of the pixel circuit: a data signal terminal Data (for writing a data signal), a resetting signal terminal Vref (for inputting a resetting signal), a positive power supply signal terminal PVDD (for inputting a positive power supply signal), a negative power supply signal terminal PVEE (for inputting a negative power supply signal), a light emission control signal terminal Emit (for inputting a light emission control signal), a first scan signal terminal S1 (for inputting a first scan signal), and a second scan signal terminal S2 (for inputting a second scan signal). Here, a transistor T2 is a data writing transistor, a transistor T7 is an anode resetting transistor, and the transistor T2 and the transistor T7 can be controlled by one control signal (the second scan signal). At present, a typical display refresh frequency is 60 Hz, or a higher refresh frequency of 120 Hz. When the display refresh frequency is 30 Hz or 15 Hz, it is generally considered as a low frequency display. With low-frequency driving, the anode of the light emitting device is reset at a low frequency, and the black frame insertion of the light emitting device can be easily recognized by human eyes, resulting in display flickers.

In order to avoid the display flicker problem, it is required to reset the anode of the light emitting device at a high frequency. In the existing driving method, the first scan signal and the second scan signal can be provided by a set of cascaded scan shift registers. A set of cascaded scan shift registers can only provide low-frequency control signals or high-frequency control signals at a time. If it is required to provide the transistor T2 and the transistor T7 with control signals of different frequencies, an additional set of driving circuits needs to be added to the display panel, which will significantly affect the bezel width of the display panel.

In view of the above problems, the embodiments of the present disclosure provide an output control device, an output control circuit and a display panel, controls the anode resetting frequency to be higher than the data writing frequency while driving the light emitting device at a low frequency for displaying. That is, the anode can be reset at a high frequency while the data signal is written at a low frequency, to avoid the flicker phenomenon due to the resetting of the anode reset and improve the display effect.

Figure 2:
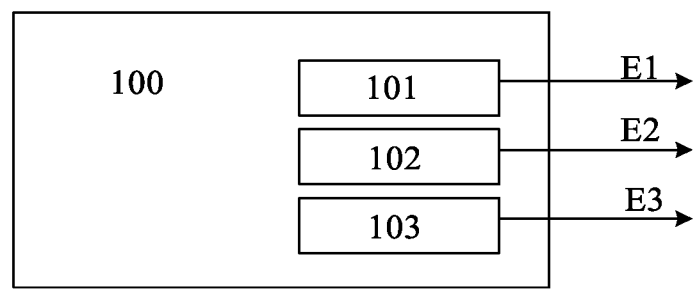
FIG. 2 is a schematic diagram showing a structure of an output control device according to an embodiment of the present disclosure.
Figure 3:
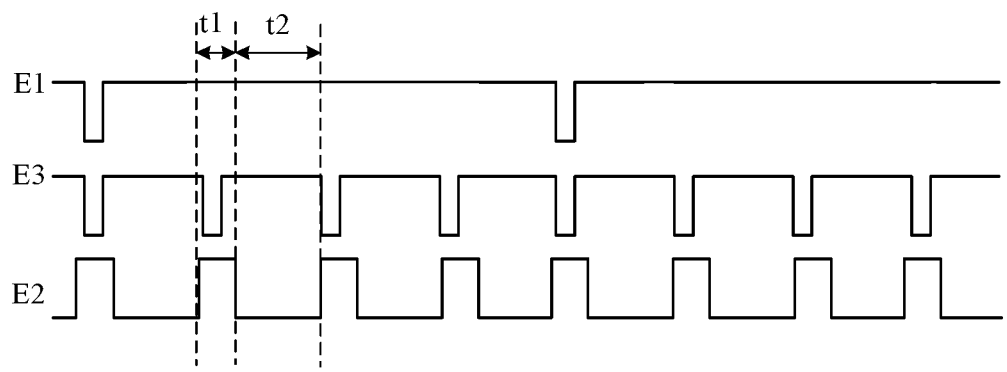
FIG. 3 is a timing sequence diagram of an output control device according to an embodiment of the present disclosure.
Figure 4:
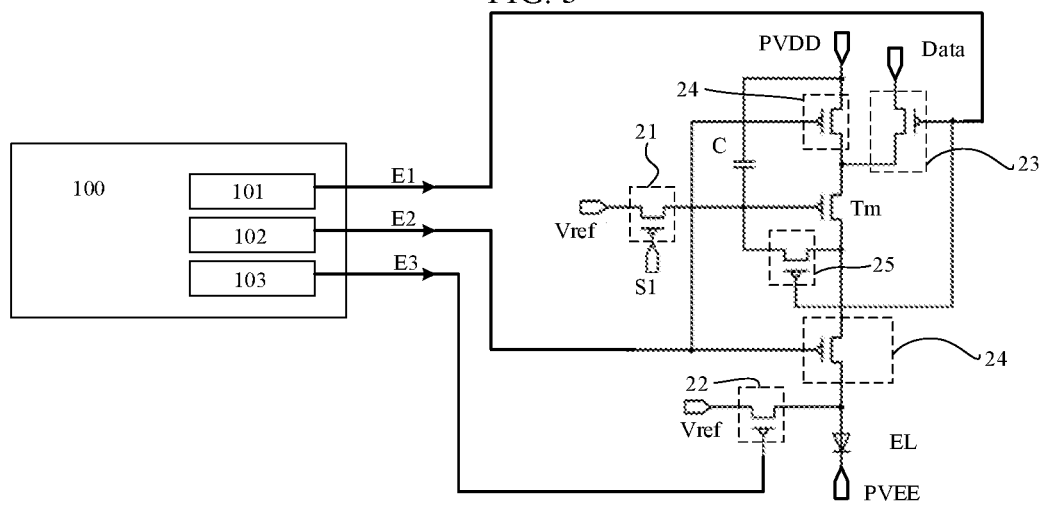
FIG. 4 is a schematic diagram of an application of an output control device provided by an embodiment of the present disclosure.
Figure 5:
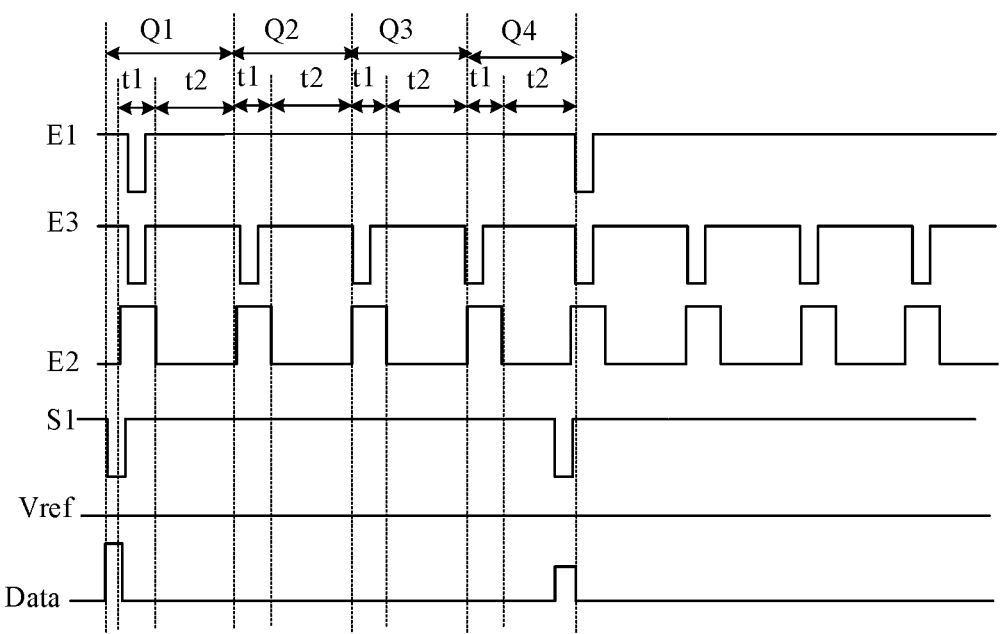
FIG. 5 is a timing sequence diagram of the pixel circuit shown in FIG. 4.

An embodiment of the present disclosure provides an output control device for providing control signals for a pixel circuit. FIG. 2 is a schematic diagram showing a structure of an output control device according to an embodiment of the present disclosure. FIG. 3 is a timing sequence diagram of an output control device according to an embodiment of the present disclosure. FIG. 4 is a schematic diagram of an application of an output control device according to an embodiment of the present disclosure. FIG. 5 is a timing sequence diagram of the pixel circuit shown in FIG. 4.

As shown in FIG. 2, an output control device 100 includes a first output device 101, a second output device 102, and a third output device 103. The first output device 101 is configured to output a first control signal E1 for controlling writing of a data signal into the pixel circuit. The second output device 102 is configured to output a second control signal E2 for controlling a light emitting element to emit light. The third output device 103 is configured to output a third control signal E3 for controlling resetting of the light emitting element. The first control signal includes a first active level signal and a first inactive level signal, the second control signal includes a second active level signal and a second inactive level signal, and the third control signal includes a third active level signal and a third inactive level signal.

As shown in FIG. 3, the frequency of the third control signal E3 is higher than the frequency of the first control signal E1. That is, the frequency of the third active level signal in the third control signal E3 is higher than the frequency of the first active level signal in the first control signal E1. Therefore, the frequency for controlling the resetting of the light emitting element is higher than the frequency of controlling the writing of the data signal into the pixel circuit.

In a first period t1, the second control signal E2 is the second active level signal, and the third control signal E3 is the third inactive level signal. In a second period t2, the second control signal E2 is the second inactive level signal, and the third control signal E3 is the third active level signal. In the figure, each of the first active level signal, the second active level signal, and the third active level signal is a low-level signal, and each of the first inactive level signal, the second inactive level signal, and the third active level signal is a high-level signal, for the purpose of illustration. FIG. 3 only illustrates the relationship between different control signals, and the present disclosure is not limited to any waveforms of the control signals.

Exemplarily, FIG. 4 shows a connection scheme of the output control device 100 and the pixel circuit. The pixel circuit may include a first resetting device 21, a second resetting device 22, a data writing device 23, a light emission control device 24, a threshold compensation device 25, a driving transistor Tm, and a light emitting element EL. The first resetting device 21 is configured to reset a gate of the driving transistor Tm. The second resetting device 22 is configured to reset the light emitting element EL. The data writing device 23 is configured to write the data signal. The light emission control device 24 is configured to control the light emitting element EL to emit light. The threshold compensation device 25 is configured to compensate a threshold voltage of the driving transistor Tm. The figure also shows various signal terminals in the pixel circuit: the data signal terminal Data, the reset signal terminal Vref, the positive power supply signal terminal PVDD, the negative power supply signal terminal PVEE, and the scan signal terminal S1. The scan signal terminal S1 provides the control signal for the first resetting device 21. According to the embodiment of the present disclosure, the first output device 101 of the output control device 100 is electrically connected to a control terminal of the data writing device 23, the second output device 102 is electrically connected to a control terminal of the light emission control device 24, and the third output device 103 is electrically connected to a control terminal of the second resetting device 22.

FIG. 5 provides a timing sequence diagram of the pixel circuit operating at a low frequency. The output control device 100 according to the embodiment of the present disclosure provides a control signal for the pixel circuit, and the pixel circuit can operate at a low frequency. Here, the control signal for the first resetting device 21 (provided by the scan signal terminal S1), the control signal for the data writing device 23 (the first control signal E1), and the signal at the data signal terminal Data are all low-frequency signals, and the control signal for the second resetting device 22 (the third control signal E3) is a high-frequency signal. The control signal for the light emission control device 24 is the second control signal E2. In the first period t1, the second control signal E2 is the second active level signal, and the third control signal E3 is the third inactive level signal. In the second period t2, the second control signal E2 is the second inactive level signal, and the third control signal E3 is the third active level signal. That is, when the light emission control device 24 is on, the third control signal E3 is the third inactive level signal, the second resetting device 22 is off, and the anode of the light emitting element EL is not reset. When the light emission control device 24 is off, the third control signal E3 is the third active level signal, and the second resetting device 22 is on to reset the anode of the light emitting element EL.

In the period Q1, a data signal is written into the pixel circuit, so the light emitting element EL emits light in this period, and the anode of the light emitting element EL is reset once in this period. In the period Q2, the period Q3, and the period Q4, no data signal is written into the pixel circuit, and the light emitting element EL does not emit light, but the anode of the light emitting element EL is reset once in each period. Thus, with low-frequency driving, the light emitting element EL can be reset at a high frequency.

In addition, during the operation of the pixel circuit, the frequency of the control signal (the scan signal S1) of the first resetting device 21 in the pixel circuit can be the same as the frequency of the first control signal E1, and the actual signal at the scan signal terminal S1 can also be provided by the output control device according to an embodiment of the present disclosure. When both the pixel circuit and the output control device are applied in the display panel, with a set of cascaded output control devices, the signal at the scan signal terminal S1 can be a signal outputted by the third output device 103 of the output control device 100 at the previous stage. The cascading scheme of the output control devices and how the cascaded output control devices are connected to the pixel circuit will be described in the following specific embodiments.

The output control device according to the embodiment of the present disclosure can provide three types of control signals for a pixel circuit: a first control signal for controlling writing of a data signal into the pixel circuit, a second control signal for controlling a light emitting element to emit light, and a third control signal for controlling resetting of the light emitting element. The frequency of the third control signal is higher than the frequency of the first control signal, and the light emitting element can be reset at a high frequency while the data signal can be written at a low frequency, solving the problem of display flickers at low frequencies. In addition, the second control signal and the third control signal cooperate to reset the light emitting element when the light emission control driving circuit in the pixel circuit is off, without resetting the light emitting element when the light emission control driving circuit is on, to ensure resetting of the light emitting element at a high frequency, without affecting normal light emission of the light emitting element. In addition, it is to be noted that the transistors in the following embodiments of the present disclosure are all described as P-type transistors for the purpose of illustration only. In one embodiment, the transistors in the embodiments of the present disclosure may be N-type transistors. In one embodiment, some of the transistors in the embodiments of the present disclosure may be P-type transistors and the others may be N-type transistors.

In one embodiment, the second control signal E2 is configured to control resetting of the anode of the light emitting element, and the third control signal E3 is configured to control the light emitting element to emit light. When the second control signal E2 is the second active level signal, the third control signal E3 is the third inactive level signal. When the second control signal E2 is the second inactive level signal, the third control signal E3 is the third active level signal. In other words, when the light emitting element is being reset, the light emitting element is not used for light emitting display. When the light emitting element is being used for light emitting display, the light emitting element is not reset. Therefore, the light emitting phase and the resetting phase of the light emitting element are independent of each other and do not overlap, which ensures resetting of the light emitting element at a high frequency, without affecting normal light emission of the light emitting element.

In an embodiment of the present disclosure, the output control device includes a scan control driving circuit and a light emission control driving circuit. In one embodiment, a third output device is added to the scan control driving circuit, and the same scan control driving circuit can provide two control signals with different frequencies at the same time, which then cooperate with the control signal outputted by the light emission control driving circuit to provide the control signals for pixel circuits. In another embodiment, a third output device is added to the light emission control driving circuit, and the frequency of the control signal outputted by the third output device is higher than the frequency of the control signal outputted by the scan control driving circuit. In the following embodiments, examples of alternative implementations of the output control device, the output control device composed of output control devices, and the display panel including the output control circuits according to the embodiments of the present disclosure will be described in detail.

Figure 6:
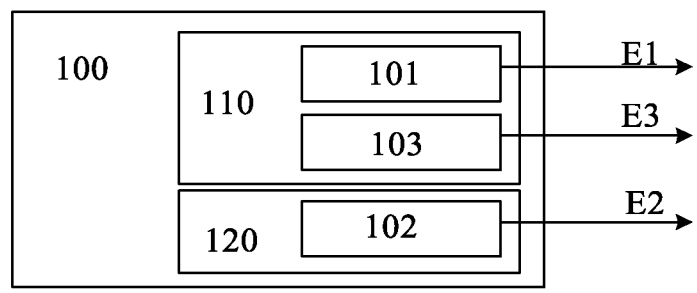
FIG. 6 is a schematic diagram showing a structure of an output control device according to an embodiment of the present disclosure.

In an embodiment, FIG. 6 is a schematic diagram showing a structure of an output control device according to an embodiment of the present disclosure. As shown in FIG. 6, in the output control device 100: the scan control driving circuit 110 includes a first output device 101 and a third output device 103, and the light emission control driving circuit 120 includes a second output device 102. In this embodiment, the third output device is added to the scan control driving circuit, and the output control device can simultaneously output two control signals with different frequencies. Furthermore, when the output control device is electrically connected to the pixel circuit, data signals can be written at a low frequencies while the light emitting element can be reset at a high frequency, avoiding the problem of display flicker in low-frequency operations. In addition, this embodiment only needs to add an output device to the scan control circuit, and does not need to add any additional control driving circuit. When applied in a display panel, it has less influence on the bezel width of the display panel.

Figure 7:
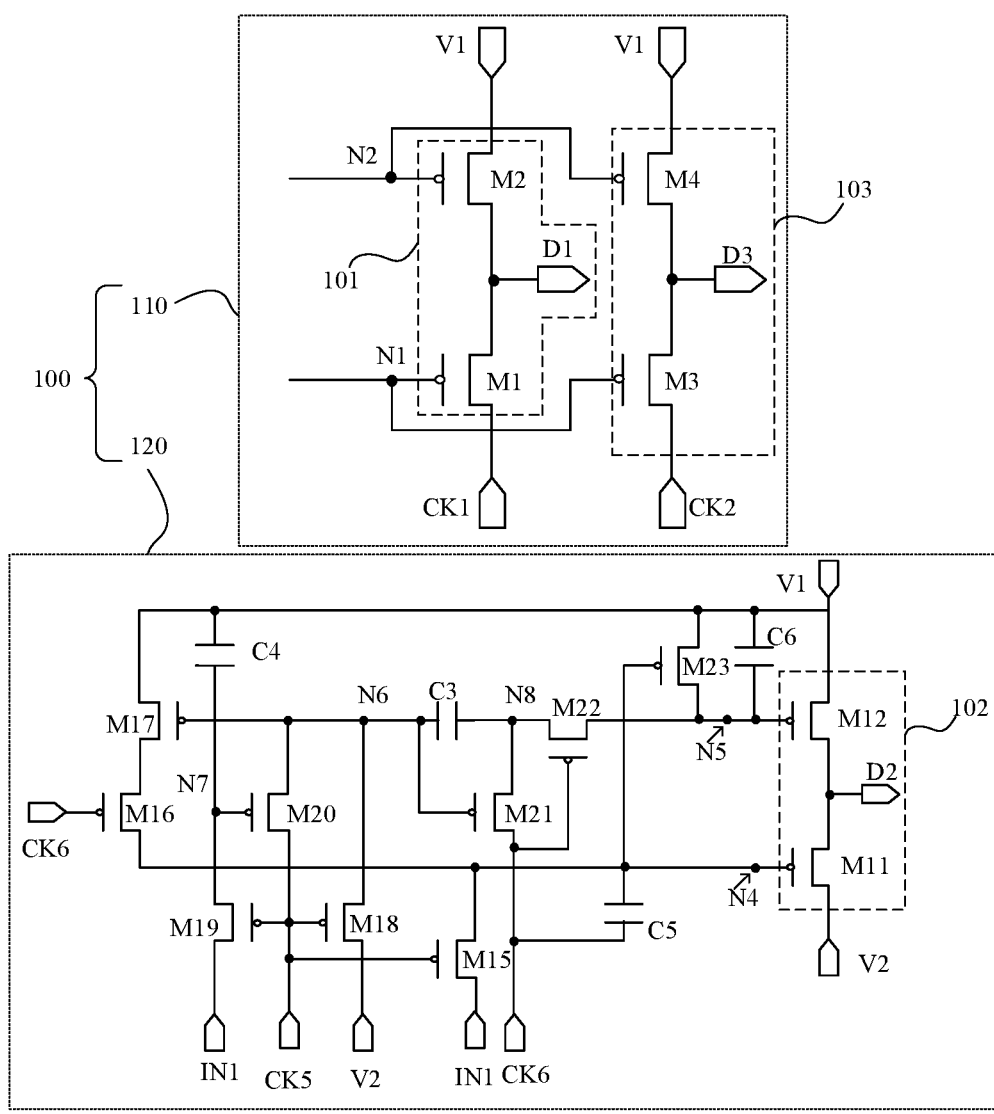
FIG. 7 is a schematic diagram showing another structure of an output control device according to an embodiment of the present disclosure.
Figure 8:
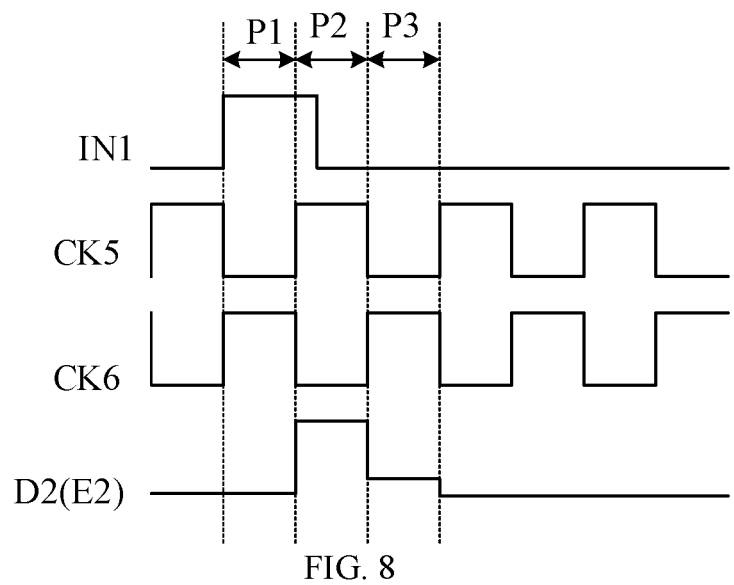
FIG. 8 is a timing sequence diagram of a light emission control driving circuit according to an embodiment of the present disclosure.

In one embodiment, FIG. 7 is a schematic diagram showing another structure of an output control device according to an embodiment of the present disclosure, and FIG. 8 is a timing sequence diagram of a light emission control driving circuit in an embodiment of the present disclosure.

As shown in FIG. 7, the scan control driving circuit 110 further includes a first node N1 and a second node N2. The first output device 101 is electrically connected to the first node N1 and the second node N2, respectively, and the first output device 101 is configured to output the first control signal E1 under control of a potential at the node N1 and a potential at the second node N2. The third output device 103 is electrically connected to the first node N1 and the second node N2, and the third output device 103 is configured to output the third control signal E3 under control of the potential at the first node N1 and the potential at the second node N2. FIG. 7 shows an output terminal D1 of the first output device 101 and an output terminal D3 of the third output device 103. In this embodiment, the first output device 101 and the third output device 103 are both connected to the first node N1 and the second node N2, and the output device added in the scan control driving circuit 110 is connected to the original circuit structure. Both output devices are controlled by the same node. Very little modification is required for the scan control driving circuit, and the driving mode is simple. The figure also shows that the first output device 101 includes a first transistor M1 and a second transistor M2, and the third output device 103 includes a third transistor M3 and a fourth transistor M4. The specific control process of the first output device 101 and the third output device 103 by the potential at the first node N1 and the potential at the second node N2 will be described below.

In this embodiment, the scan control driving circuit 110 includes the third output device 103 and the first output device 101. The second output device 102 in the light emission control driving circuit 120 is configured to output the second control signal E2 for controlling the light emitting element to emit light. The design of the light emission control driving circuit 120 may remain unchanged, and the light emission control driving circuit 120 may be any light emission control driving circuit in the related art. The light emission control driving circuit 120 in FIG. 7 is shown for the purpose of illustration only. FIG. 7 shows that the light emission control driving circuit 120 includes a fourth node N4 and a fifth node N5. The second output device 102 is electrically connected to the fourth node N4 and the fifth node N5, respectively, and the second output device 102 is configured to output the second control signal E2 under control of a potential at the fourth node N4 and a potential at the fifth node N5. The second output device 102 includes an output terminal D2. FIG. 7 also shows a sixth node N6, a seventh node N7, and an eighth node N8 in the light emission control driving circuit 120, as well as an eleventh transistor M11, a twelfth transistor M12, and a fifteenth transistor M15 to a twenty-third transistor M23, and a third capacitor C3 to a sixth capacitor C6. Here, the fourth capacitor C4 is configured to maintain a potential at the seventh node N7, the third capacitor C3 is configured to control a potential at the eighth node N8, the fifth capacitor C5 is configured to maintain a potential at the fourth node N4, and the sixth capacitor C6 is configured to maintain a potential at the fifth node N5. The transistors in the light emission control driving circuit 120 in FIG. 7 are all shown as P-type transistors.

Referring to the timing sequence diagram in FIG. 8, in this example, the first voltage signal terminal V1 is at a high level and the second voltage signal terminal V2 is at a low level. At time P1, the fifth clock signal terminal CK5 provides an active level signal, the sixth clock signal terminal CK6 provides an inactive level signal, and the input terminal IN1 provides a high-level signal. The nineteenth transistor M19 is turned on to provide the high-level signal at the input terminal IN1 to the seventh node N7, and the twentieth transistor M20 is turned off. The eighteenth transistor M18 is turned on to provide a low-level signal to the sixth node N6. The sixth node N6 controls the twenty-first transistor M21 to turn on, to provide the high-level signal at the sixth clock signal terminal CK6 to the eighth node N8. The fifteenth transistor M15 is turned on to provide the high-level signal at the input terminal IN1 to the fourth node N4. At this time, the fourth node N4, the sixth node N6, the eighth node N8, and the seventh node N7 are reset. In this case, the fourth node N4 is at the high-level potential, the seventh node N7 is at the high-level potential, the sixth node N6 is at the low-level potential, the eighth node N8 is at the high-level potential, and the fifth node N5 is at the high-level potential. The eleventh transistor M11 and the twelfth transistor M12 in the second output device 102 are both off. At time P2, the fifth clock signal terminal CK5 provides an inactive level signal, the sixth clock signal terminal CK6 provides an active level signal, and the input terminal IN1 provides a low-level signal. In this phase, the signal at the sixth clock signal terminal CK6 controls the twenty-second transistor M22 to turn on. At this time, the fourth node N4 is at the high-level potential, and the potential at the fifth node N5 is pulled down. The output terminal D2 of the second output device 102 outputs the high-level signal at the first voltage signal terminal V1. At time P3, the fifth clock signal terminal CK5 provides an active level signal, the sixth clock signal terminal CK6 provides an inactive level signal, and the input terminal IN1 provides a low-level signal. At time P3, the nineteenth transistor M19 is turned on again, and a low-level signal is written into the seventh node N7 to maintain a low potential. The eighteenth transistor M18 is turned on, and a low potential is written into the sixth node N6. The fifteenth transistor M15 is turned on, a low potential is written into the fourth node N4. Due to the effect of the fifth capacitor C5, the fourth node N4 maintains a low potential. The fourth node N4 maintains a low potential, the twenty-third transistor M23 is controlled to be turned on to write the high level at the first voltage signal terminal V1 into the fifth node N5, to control the fifth node N5 to maintain the high potential. Therefore, the output terminal D2 of the second output device 102 outputs the low-level signal at the second voltage signal terminal V2. When applied in the process of driving the pixel circuit, the above operation process is repeated, and the second output device 102 can output the second control signal E2 at a frequency.

Figure 9:
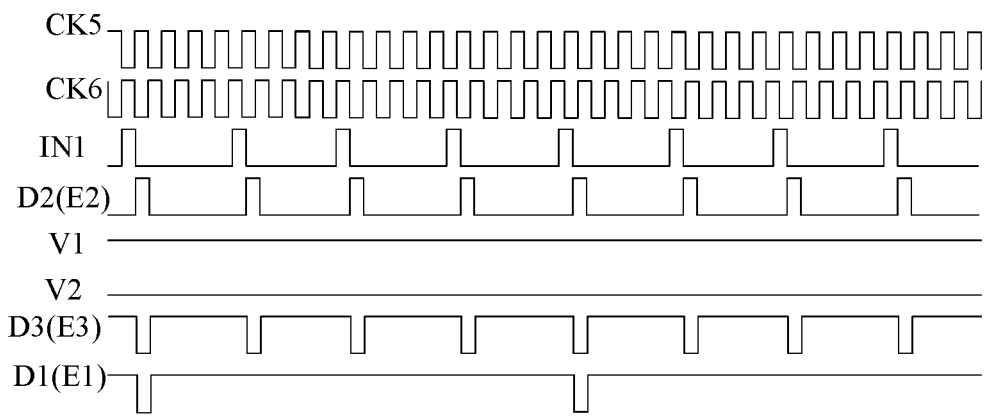
FIG. 9 is a timing sequence diagram of the output control device according to the embodiment of FIG. 7.

FIG. 9 is a timing sequence diagram of the output control device in the embodiment of FIG. 7. As shown in FIG. 9, in the scan control driving circuit 110, by controlling the potentials at the first node N1 and the second node N2, the first output device 101 can output the first control signal E1 and the third output device 103 can output the third control signal E3. The frequency of the third control signal E3 is higher than the frequency of the first control signal E1. Then, by designing the clock signal for the light emission control driving circuit 120 and the signal at the input terminal IN1, the light emission control driving circuit 120 and the scanning control driving circuit 110 can cooperate and the second output device 102 outputs the second control signal E2. In the first period, the second control signal E2 is the second active level signal, and the third control signal E3 is the third inactive level signal. In the second period, the second control signal E2 is the second inactive level signal, and the third control signal E3 is the third active level signal. Thus, the output control device can provide three types of control signals for the pixel circuit: a first control signal for controlling writing of a data signal into the pixel circuit, a second control signal for controlling a light emitting element to emit light, and a third control signal for controlling resetting of the light emitting element. The frequency of the third control signal is higher than the frequency of the first control signal, and the light emitting element can be reset at a high frequency while the data signal can be written at a low frequency, solving the problem of display flickers at low frequencies and ensuring resetting of the light emitting element at a high frequency, without affecting normal light emission of the light emitting element.

Figure 10:
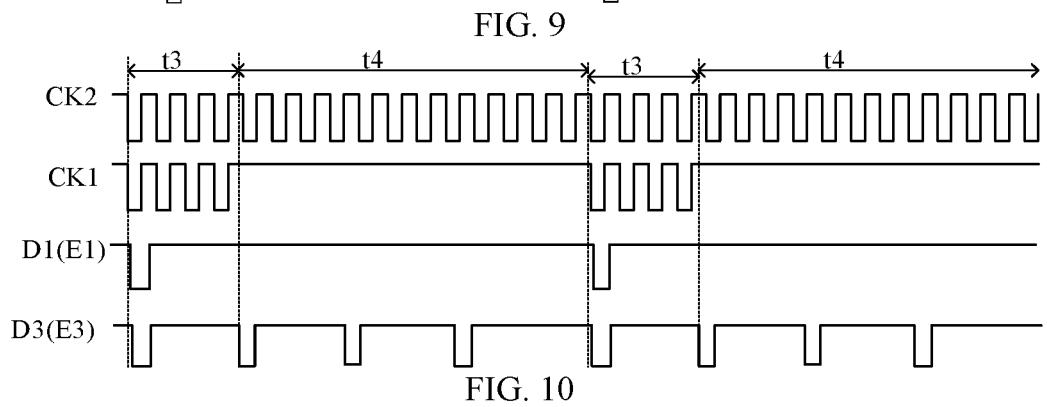
FIG. 10 is a timing sequence diagram of a scan control driving circuit according to an embodiment of the present disclosure.

FIG. 10 is a timing sequence diagram of the scan control driving circuit in the embodiment of the present disclosure.

Reference is now made to FIG. 7 again, taken in conjunction with the timing sequence diagram in FIG. 10. As shown in FIG. 7, the first output device 101 is further electrically connected to the first voltage signal terminal V1 and the first clock signal terminal CK1, and the first output device 101 is configured to provide the signal at the clock signal terminal CK1 to the output terminal D1 of the first output device 101 under control of the potential at the first node N1, and to provide the signal at the first voltage signal terminal V1 to the output terminal D1 of the first output device 101 under control of the potential at the second node N2. The third output device 103 is further electrically connected to the first voltage signal terminal V1 and the second clock signal terminal CK2, and the third output device 103 is configured to provide the signal at the second clock signal terminal CK2 to the output terminal D3 of the third output device 103 under control of the potential at the first node N1, and to provide the signal at the first voltage signal terminal V1 to the output terminal D3 of the third output device 103 under control of the potential at the second node N2.

That is, when the potential at the first node N1 is the active potential, the first node N1 simultaneously controls the output of the first output device 101 and the output of the third output device 103. When the potential at the second node N2 is the active potential, the second node N2 simultaneously controls the output of the first output device 101 and the output of the third output device 103. As shown in FIG. 10, as a whole, the signal frequency of the second clock signal terminal CK2 is higher than the signal frequency of the first clock signal terminal CK1. By controlling the potential at the first node N1, the potential at the first node N1 and the signal frequency of the second clock signal terminal CK2 can cooperate and the frequency of the third output device 103 outputting the third control signal E3 is higher than the frequency of the first output device 101 outputting the first control signal E1. Furthermore, the output control device can provide two control signals with different frequencies for the pixel circuit, to write the data signal at a low frequency while resetting the light emitting element at a high frequency, avoiding the display flicker problem in low-frequency operations.

When applied in low-frequency display, the time period t3 in the timing sequence diagram of FIG. 10 corresponds to the time period during which the display panel is controlled to display one frame of picture, and the time period t4 is the time period during which the display panel maintains the display of the previous frame of picture. In the time period t3, the first control signal E1 outputted by the output control device 100 includes the first active level signal, and the corresponding data signal can be written into the pixel circuit, and the light emitting element can emit light for display. In the time period t4, the first control signal E1 outputted by the output control device 100 is the first inactive level signal, so no data signal is written into the pixel circuit and the light emitting element does not emit light. In the time period t4, the third control signal E3 still provides the third active level signal to control the light emitting element to be reset, resetting the light emitting element at a high frequency.

Further, referring to FIG. 7 again, the first output device 101 includes a first transistor M1 and a second transistor M2. The gate of the first transistor M1 is electrically connected to the first node N1, the first terminal of the first transistor M1 is electrically connected to the first clock signal terminal CK1, and the second terminal of the first transistor M1 is electrically connected to the output terminal D1 of the first output device 101. The gate of the second transistor M2 is electrically connected to the second node N2, the first terminal of the second transistor M2 is electrically connected to the first voltage signal terminal V1, and the second terminal of the second transistor M2 is electrically connected to the output terminal D1 of the first output device 101.

The third output device 103 includes a third transistor M3 and a fourth transistor M4. The gate of the third transistor M3 is electrically connected to the first node N1, the first terminal of the third transistor M3 is electrically connected to the second clock signal terminal CK2, and the second terminal of the third transistor M3 is electrically connected to the output terminal D3 of the third output device 103. The gate of the fourth transistor M4 is electrically connected to the second node N2, the first terminal of the fourth transistor M4 is electrically connected to the first voltage signal terminal V1, and the second terminal of the fourth transistor M4 is electrically connected to the output terminal D3 of the third output device 103.

In this embodiment, by adding two transistors and one clock signal terminal, the scan control driving circuit can output two control signals with different frequencies at the same time, with a simple design. Furthermore, the output control device composed of the scan control driving circuit and the light emission control driving circuit can provide three types of control signals for the pixel circuit to avoid the display flicker problem in low-frequency display. When it is applied in the display panel, no additional driving circuit is needed, which facilitates narrowing the bezel of the display panel.

Figure 11:
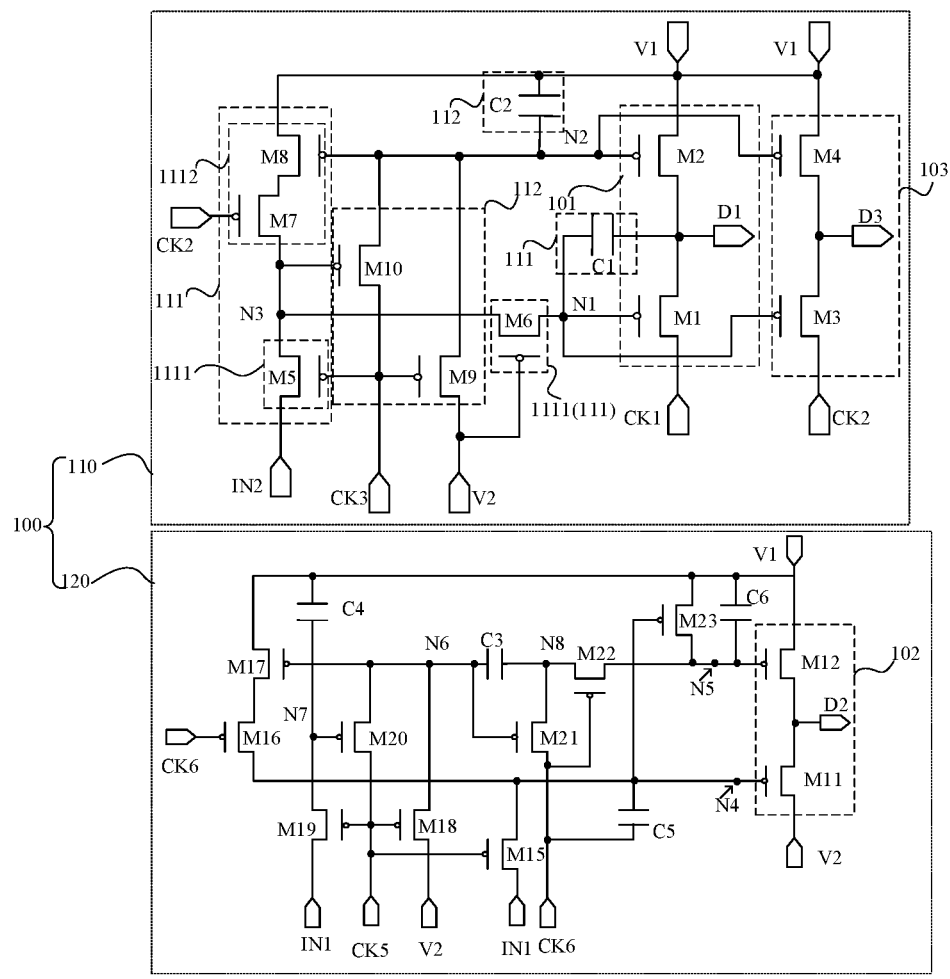
FIG. 11 is a schematic diagram showing another structure of an output control device according to an embodiment of the present disclosure.
Figure 12:
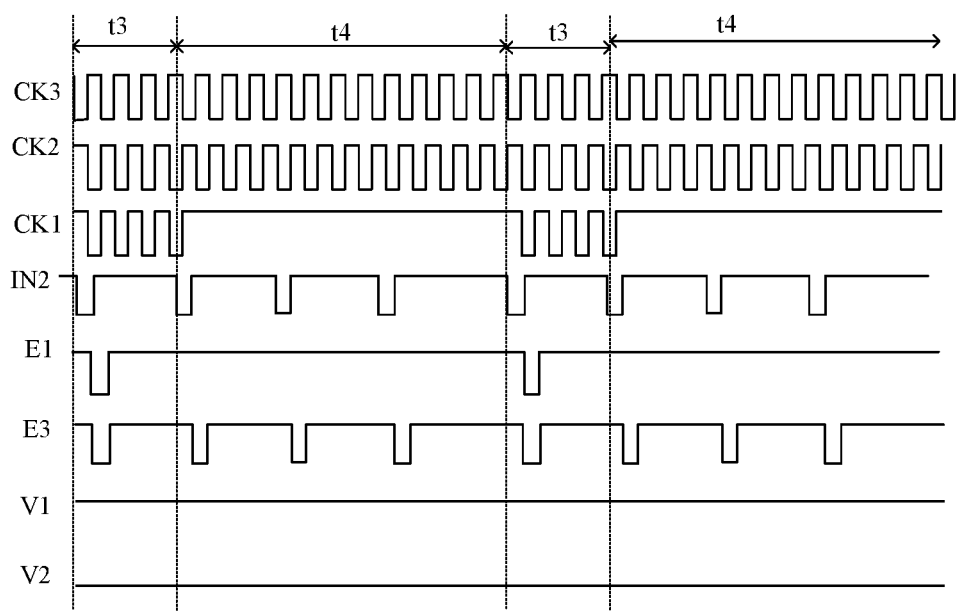
FIG. 12 is a timing sequence diagram of the scan control driving circuit shown in FIG. 11.

Further, FIG. 11 is a schematic diagram showing another structure of an output control device according to an embodiment of the present disclosure. FIG. 12 is a timing sequence diagram of the scan control driving circuit in FIG. 11.

As shown in FIG. 11, the scan control driving circuit 110 further includes a first node control device 111 and a second node control device 112. The first node control device 111 is electrically connected to the input terminal IN2 of the scan control driving circuit, the second clock signal terminal CK2, the third clock signal terminal CK3, the first voltage signal terminal V1, the second voltage signal terminal V2, and the second node N2, and is configured to control the level at the first node N1 according to the signal at the input terminal IN2 of the driving circuit 110, the signal at the second clock signal terminal CK2, the signal at the third clock signal terminal CK3, the signal at the second voltage signal terminal V2, and the level at the second node N2. The signal at the second clock signal terminal CK2 and the signal at the third clock signal terminal CK3 are opposite to each other.

The second node control device 112 is electrically connected to the third clock signal terminal CK3, the second voltage signal terminal V2, and the third node N3, and is configured to control the level at the second node N2 according to the signal at the third clock signal terminal CK3, the signal V2 at the second voltage signal terminal, and the level at the node N3.

For the circuit structure and operation process of the light emission control driving circuit 120 in the embodiment of FIG. 11, reference can be made to the embodiment of FIG. 7, and the description thereof will be omitted here.

As shown in the timing sequence diagram of FIG. 12, the first voltage signal terminal V1 is at a high level, the second voltage signal terminal V2 is at a low level, and the signal at the second clock signal terminal CK2 and the signal at the third clock signal terminal CK3 are opposite to each other.

Overall, the signal frequency of the second clock signal terminal CK2 is higher than the signal frequency of the first clock signal terminal CK1. The signal frequency of the input terminal IN2 of the scan control driving circuit 110 is the same as the frequency of the third control signal E3. When applied in a display panel, the input terminal IN2 of the scan control driving circuit can be connected to the output terminal of the third output device of the output control device at the previous stage.

When applied in low-frequency display, the time period t3 in the timing sequence diagram of FIG. 12 corresponds to the time period during which the control display panel displays one frame of picture, and the time period t4 is the time period during which the display panel maintains the display of the previous frame. In the time period t3, the first control signal E1 outputted by the output control device 100 includes the first active level signal, and the corresponding data signal is written into the pixel circuit, and the light emitting element emits light for display. In the time period t4, the first control signal E1 outputted by the output control device 100 is the first inactive level signal, so no data signal is written into the pixel circuit, and the light emitting element does not emit light.

Further, referring to FIG. 11 again, the first node control device 111 includes a first input sub-device 1111 and a first protection sub-device 1112. The first input sub-device 1111 is configured to provide the signal at the input terminal IN2 of the scan control driving circuit 110 to the third node N3 according to the signal at the third clock signal terminal CK3. Under control of the signal at the second voltage signal terminal V2, the third node N3 provides a level signal to the first node N1. The protection sub-device 1112 is configured to control the level at the third node N3 according to the level at the second node N2 and the signal at the second clock signal terminal CK2. The third node N3 provides a level signal for the first node N1, so the level at the third node N3 will affect the level at the first node N1. By providing the first protection sub-device 1112, for example, when the second node N2 is at a low level and the second clock signal terminal CK2 provides a low-level signal, the third node N3 can be controlled to be at the high level, and then the first node N1 is at the high level. At this time, the signal outputted from the scan control driving circuit 110 is only controlled by the second node N2, the first output device 101 outputs the signal at the first voltage signal terminal V1, and the third output device 103 outputs the signal at the first voltage signal terminal V1. When the output of the scan control driving circuit needs to be controlled by the second node N2, it is ensured that the first node N1 and the second node N2 have opposite potentials to ensure the stability and reliability of the signal outputted from the output terminal of the scan control driving circuit.

In one embodiment, referring to FIG. 11 again, the first input sub-device 1111 includes a fifth transistor M5 and a sixth transistor M6. The gate of the fifth transistor M5 is electrically connected to the third clock signal terminal CK3, the first terminal of the fifth transistor M5 is electrically connected to the input terminal IN2 of the scan control driving circuit 110, and the second terminal of the fifth transistor M5 is electrically connected to the third node N3. Therefore, under control of the third clock signal terminal CK3, the fifth transistor M5 can provide the signal inputted from the input terminal IN2 to the third node N3.

The gate of the sixth transistor M6 is electrically connected to the second voltage signal terminal V2, the first terminal of the sixth transistor M6 is electrically connected to the third node N3, and the second terminal of the sixth transistor M6 is electrically connected to the first node N1. The control terminal of the sixth transistor M6 is electrically connected to the second voltage signal terminal V2. When the transistor is a P-type transistor and the second voltage signal terminal V2 inputs a low-level signal, the sixth transistor M6 is always on.

The first protection sub-device 1112 includes a seventh transistor M7 and an eighth transistor M8. The gate of the seventh transistor M7 is electrically connected to the second clock signal terminal CK2, the first terminal of the seventh transistor M7 is connected to the second terminal of the eighth transistor M8, and the second terminal of the seventh transistor M7 is electrically connected to the third node N3. The gate of the eighth transistor M8 is electrically connected to the second node N2, and the first terminal of the eighth transistor M8 is electrically connected to the first voltage signal terminal V1. When the transistors are P-type transistors as an example, when the second node N2 is at a low level and the second clock signal CK2 is at a low level, the seventh transistor M7 and the eighth transistor M8 are both turned on, and the high-level signal at the first voltage signal terminal V1 is provided to the third node N3, and the third node N3 provides the high-level signal to the first node N1 through the sixth transistor M6, to control the potential at the first node N1.

In one embodiment, referring to FIG. 11, the second node control device 112 includes a ninth transistor M9 and a tenth transistor M10. The gate of the ninth transistor M9 is electrically connected to the third clock signal terminal CK3, the first terminal of the ninth transistor M9 is electrically connected to the second voltage signal terminal V2, and the second terminal of the ninth transistor M9 is electrically connected to the second node N2. When the third clock signal terminal CK3 provides an active level signal, the ninth transistor M9 is turned on, and the low-level signal at the second voltage signal terminal V2 is provided to the second node N2, and the second node N2 controls the output of the scanning control driving circuit. The gate of the tenth transistor M10 is electrically connected to the third node N3, the first terminal of the tenth transistor M10 is electrically connected to the third clock signal terminal CK3, and the second terminal of the tenth transistor M10 is electrically connected to the second node N2. When the third node N3 is at a low level (the first node N1 is also at a low level at this time), the tenth transistor M10 is turned on, and at this time, the third clock signal terminal CK3 writes a high-level signal into the second node N2. In this case, the first node N1 is at a low level and the second node N2 is at a high level, and the first node N1 controls the output of the scan control driving circuit. Here, the tenth transistor M10 serves as a protection transistor. When the output of the scan control driving circuit needs to be controlled by the first node N1, it is ensured that the second node N2 and the first node N1 have opposite potentials.

Further, referring to FIG. 11 again, the first node control device 111 includes a first capacitor C1 having an electrode electrically connected to the first node N1 and another electrode electrically connected to the output terminal D1 of the first output device 101. The second node control device 112 includes a second capacitor C2 having an electrode electrically connected to the second node N2 and another electrode electrically connected to the first voltage signal terminal V1. Here, the first capacitor C1 and the second capacitor C2 both have coupling effects. The first capacitor C1 is configured to stabilize the potential at the first node N1. When the first node N1 needs to control the output of the scan control driving circuit, it is ensured that the first node N1 can maintain the active level potential. The second capacitor C2 is configured to stabilize the potential at the second node N2. When the second node N2 needs to control the output of the scan control driving circuit, it is ensured that the second node N2 can maintain the active level potential.

Figure 13:
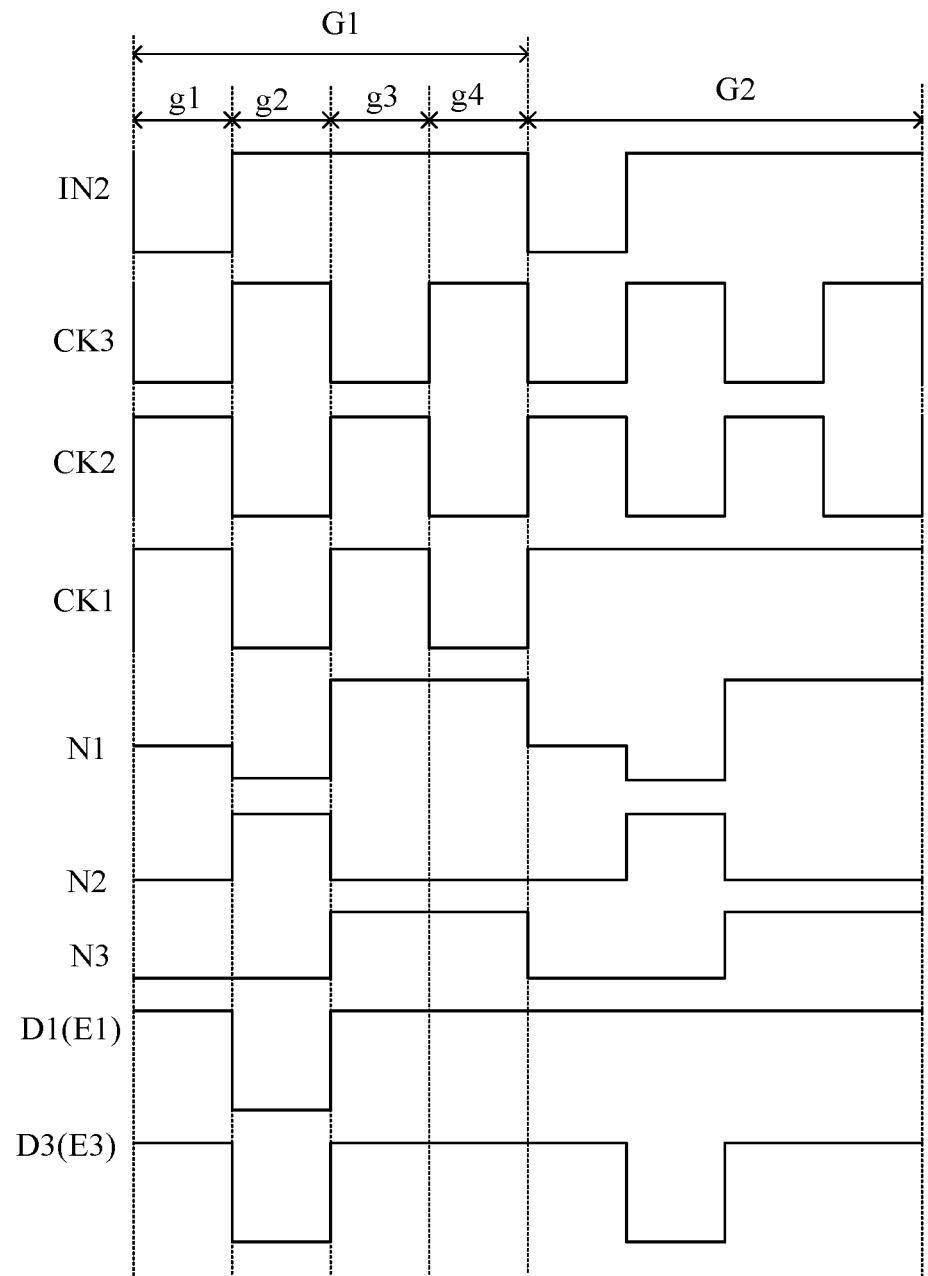
FIG. 13 is a timing sequence diagram of a scan control driving circuit according to an embodiment of the present disclosure.

In an embodiment, the scan control driving circuit in the output control device includes ten transistors (the first transistor M1 to the tenth transistor M10) and two capacitors. With reference to the circuit structure illustrated in FIG. 11 and the timing sequence diagram illustrated in FIG. 13, FIG. 13 is a timing sequence diagram of a scan control driving circuit according to an embodiment of the present disclosure. FIG. 13 illustrates two operation time periods of the scan control driving circuit. In the first operation time period G1, the first output device 101 and the third output device 103 each output an active level signal. In the operation period G2, only the third output device 103 outputs an active level signal once. One operation period of the scan control driving circuit includes four phases, and the first operation period G1 is taken as an example for description.

In the first phase g1, the third clock signal terminal CK3 provides a low-level signal, and the second clock signal terminal CK2 provides a high-level signal, the fifth transistor M5 and the ninth transistor M9 are turned on, and the seventh transistor M7 is turned off. The fifth transistor M5 writes the low-level signal at the input terminal IN2 into the third node N3, the second voltage signal terminal V2 provides a low-level signal, and the sixth transistor M6 is on, and the third node N3 provides the low-level signal to the first node N1. The ninth transistor M9 is turned on, the low-level signal at the second voltage signal terminal V2 is written into the second node N2. The second node N2 is at a low level, the eighth transistor M8 is turned on, and the signal at the second clock signal terminal CK2 and the signal at the third clock signal terminal CK3 are opposite to each other. At this time, the second clock signal terminal CK2 provides a high-level signal, and the seventh transistor M7 is turned off. In this phase, the first node N1 and the second node N2 are both at the low level. The output terminal D1 of the first output device 101 outputs the high-level signal at the first voltage signal terminal V1 and the high-level signal at the first clock signal terminal CK1. The output terminal D3 of the third output device 103 outputs the high-level signal at the first voltage signal terminal V1 and the high-level signal at the second clock signal terminal CK2.

In the second phase g2, the third clock signal terminal CK3 provides a high-level signal, and the second clock signal terminal CK2 provides a low-level signal. At this time, the fifth transistor M5 and the ninth transistor M9 are both turned off, and the seventh transistor is turned on. With the coupling effect of the first capacitor C1, the potential at the first node N1 continues to be pulled down. In this phase, the third node N3 maintains a low level, and the tenth transistor M10 is controlled to be turned on. The high-level signal at the third clock signal terminal CK3 is written into the second node N2, and the second node N2 controls the eighth transistor M8 to be turned off. In this phase, the first node N1 is at a low level, and the second node N2 is at a high level. Then, the output terminal D1 of the first output device 101 outputs the low-level signal at the first clock signal terminal CK1 (which is the first active level signal of the first control signal E1). The output terminal D3 of the third output device 103 outputs the low-level signal at the second clock signal terminal CK2 (which is the third active level signal of the third control signal E3).

In the third phase g3, the third clock signal terminal CK3 provides a low-level signal, the second clock signal terminal CK2 provides a high-level signal, and the input terminal IN2 inputs a high-level signal. In this phase, a low potential is written into the second node N2 and the potential at the first node N1 is pulled up. At this time, the signal outputted from the output terminal of the scan control driving circuit is controlled by the second node N2. The output terminal D1 of the first output device 101 outputs the high-level signal at the first voltage signal terminal V1. The output terminal D3 of the third output device 103 outputs the high-level signal at the first voltage signal terminal V1.

In the fourth phase g4, the second node N2 maintains a low potential, the first node N1 maintains a high potential, and the output terminal D1 of the first output device 101 outputs the high-level signal at the first voltage signal terminal V1. The output terminal D3 of the third output device 103 outputs the high-level signal at the first voltage signal terminal V1.

The on state of each transistor in each phase in the second operation period G2 is the same as that in the first operation period G1. However, since the signal frequency of the first clock signal terminal CK1 is lower than the signal frequency of the second clock signal terminal CK2, in the second operation period G2, the output terminal D1 of the first output device 101 does not output an active level signal, and the output terminal D3 of the third output device 103 still outputs an active level signal once. Thus, the frequency of the third control signal E3 is higher than the frequency of the first control signal E1. That is, in the output control device according to the embodiment of the present disclosure, the scan control driving circuit can output two control signals with different frequencies.

Figure 14:
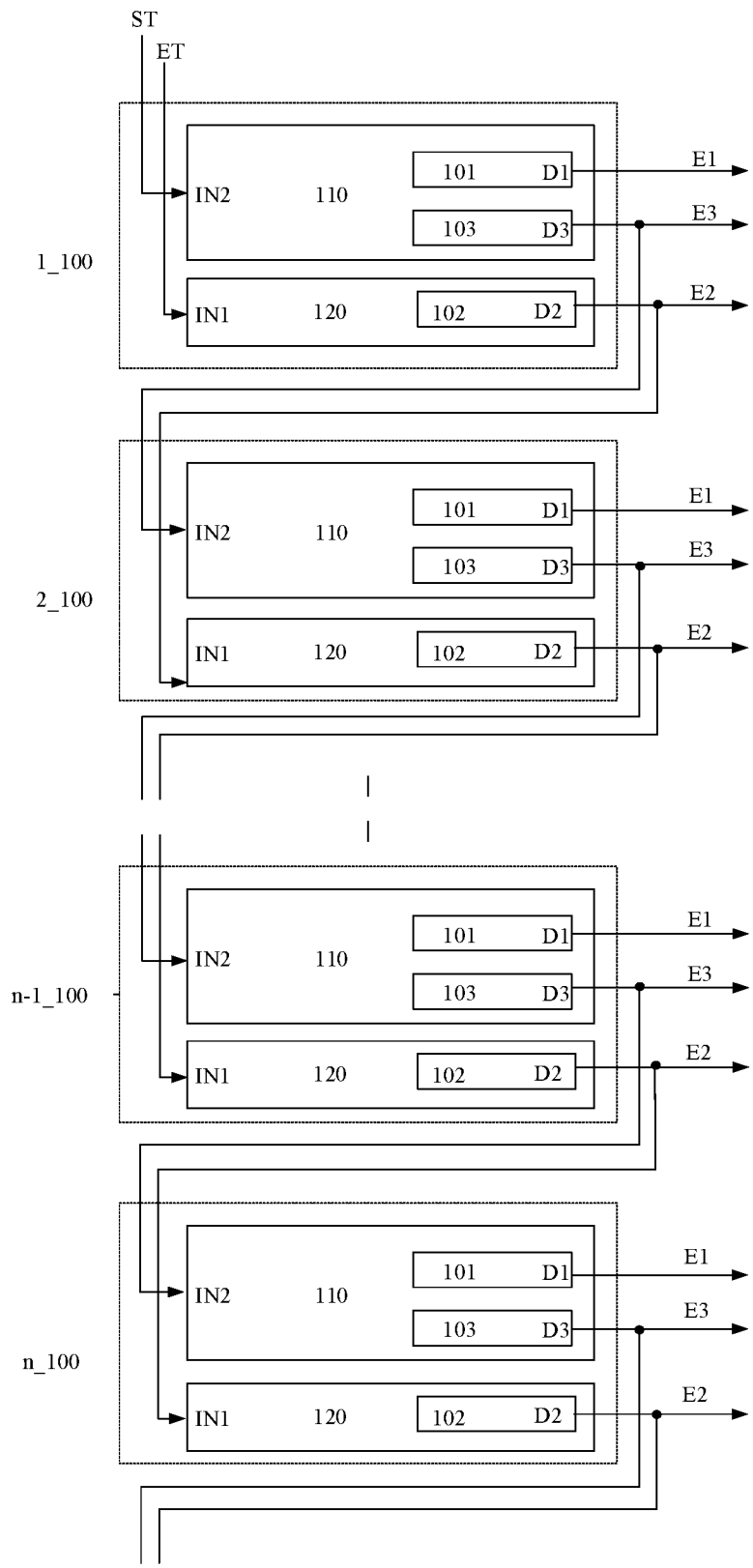
FIG. 14 is a block diagram of an output control circuit according to an embodiment of the present disclosure.

Further, an embodiment of the present disclosure provides an output control circuit including a plurality of stages of output control devices each being the output control device in any of the embodiments of FIGS. 4 to 13. FIG. 14 is a block diagram of an output control circuit according to an embodiment of the present disclosure.

As shown in FIG. 14, the input terminal IN2 of the scan control driving circuit 110 in the output control device at the first stage 1_100 inputs a start scan shift signal ST, and the input terminal IN1 of the light emission control driving circuit 120 in the output control device at the first stage 1_100 inputs a start light emission shift signal ET.

The input terminal IN2 of the scan control driving circuit 110 in the output control device 2_100 at the second stage is electrically connected to the output terminal D3 of the third output device 103 of the scan control driving circuit 110 in output control device at the first stage 1_100. The input terminal IN1 of the light emission control driving circuit 120 in the output control device at the second stage 2_100 is electrically connected to the output terminal D2 of the second output device 102 of the light emission control driving circuit 120 in the output control device at the first stage 1_100.

The input terminal IN2 of the scan control driving circuit 110 in the output control device at the n-th stage n_100 is electrically connected to the output terminal D3 of the third output device 103 of the scan control driving circuit 110 in the output control device at the (n−1)-th stage n−1_100, The input terminal IN1 of the light emission control driving circuit 120 in the output control device at the n-th stage n_100 is electrically connected to the output terminal D2 of the second output device 102 of the light emission control driving circuit 120 in the output control device at the (n−1)-th stage n−1_100, where n is a positive integer, and n≥2.

For the output control device at each stage, the first output device 101 outputs a first control signal E1, the second output device 102 outputs a second control signal E2, and the third output device 103 outputs a third control signal E3.

In this embodiment, the scan control driving circuits are arranged in a cascaded manner, and the light emission control driving circuits are arranged in a cascaded manner. Here, for the scan control driving circuit, the signal at the first clock signal terminal, the signal at the second clock signal terminal, and the signal at the third clock signal terminal are required for driving the scan control driving circuit at each stage. Here, the signal at the second clock signal terminal and the signal at the third clock signal terminal are opposite to each other, and the signal frequency of the second clock signal terminal is higher than the signal frequency of the first clock signal terminal. In order to provide the cascaded configuration of the scan control driving circuits, it is required to have a design where the signals at the first clock signal terminals in the scan control driving circuits at two adjacent stages are opposite to each other. That is, the signals at the first clock signal terminals of the scan control driving circuit at the odd-numbered stage and the scan control driving circuit at the even-numbered stage are opposite to each other. Therefore, an additional pair of clock signals needs to be added in this embodiment, and the scan control driving circuit can output control signals with two different frequencies. In one embodiment of the present disclosure only includes a set of cascaded scan control driving circuits and a set of cascaded light emission control driving circuits.

Figure 15:
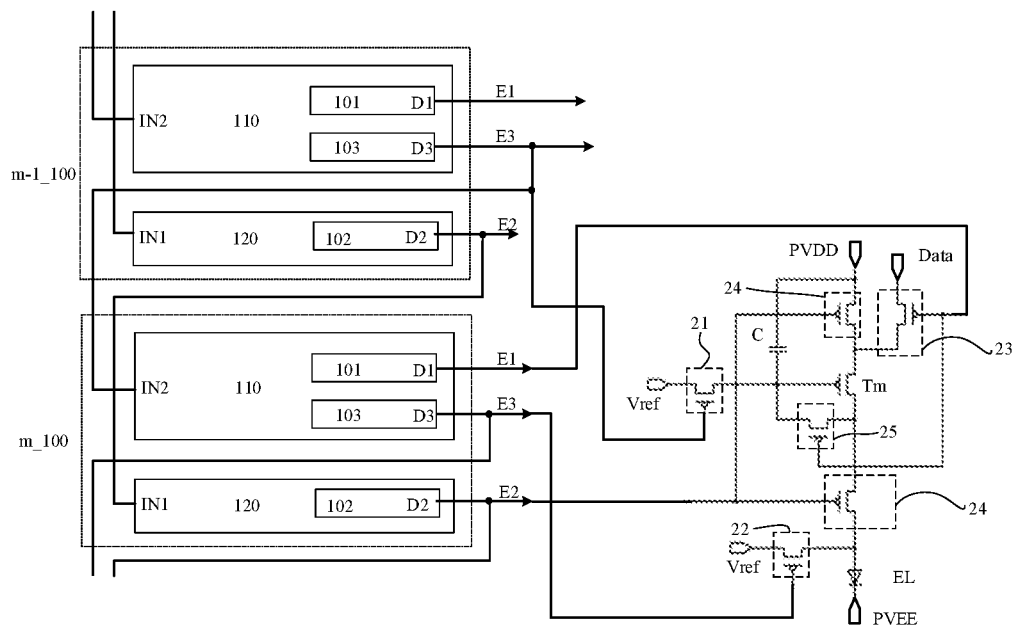
FIG. 15 is a schematic diagram showing a circuit structure in a display panel according to an embodiment of the present disclosure.

Further, an embodiment of the present disclosure also provides a display panel, which includes the output control circuit in the embodiment of FIG. 14 as described above. The display panel further includes a plurality of pixel circuits arranged in an array. Each pixel circuit includes a first resetting device, a second resetting device, a data writing device, a light emission control device, a driving transistor, and a light emitting element. The first resetting device is configured to reset the gate of the driving transistor. The second resetting device is configured to reset the light emitting element. The data writing device is configured to write a data signal. The light emission control device is configured to control the light emitting element to emit light. The output control device at each stage in the display panel can drive a plurality of pixel circuits in one row at the same time, or the output control device at each stage can drive a plurality of pixel circuits in two or more rows at the same time. The following only illustrates a connection scheme of the pixel circuit and the output control device. FIG. 15 is a schematic diagram showing a circuit structure in a display panel according to an embodiment of the present disclosure. As shown in FIG. 15, the structure of the pixel circuit in FIG. 15 is illustrative only. In one pixel circuit:

a control terminal of the first resetting device 21 is electrically connected to the third output device 103 of the scan control driving circuit 110 in the output control device at the (m−1)-th stage m−1_100, where m is a positive integer, and m≥2;

a control terminal of the second resetting device 22 is electrically connected to the third output device 103 of the scan control driving circuit 110 in output control device at the m-th stage m_100;

a control terminal of the data writing device 23 is electrically connected to the first output device 101 of the scan control driving circuit 110 in the output control device at the m-th stage m_100; and a control terminal of the light emission control device 24 is electrically connected to the second output device 102 of the light emission control driving circuit 120 in the output control device m_100 at the m-th stage.

With the above connection scheme, the first control signal outputted by the first output terminal in the output control device controls data writing, the control signal outputted by the second output terminal controls the light emitting element to emit light, and the third control signal outputted by the third output terminal controls resetting of the anode of the light emitting element. Here, the signal frequency of the third control signal is higher than the signal frequency of the first control signal. In the first period, the second control signal is the second active level signal, and the third control signal is the third inactive level signal. In the second period, the second control signal is the second inactive level signal, and the third control signal is the third active level signal. The data signal can be written at a low frequency while the light emitting element can be reset at a high frequency, to avoid the problem of display flicker in low-frequency operations. At the same time, the second control signal and the third control signal cooperate and the light emitting element can be reset when the light emission control device in the pixel circuit is off, and the light emitting element is not reset when the light emission control device is on, ensuring that the light emitting element can be reset at a high frequency, without affecting normal light emission of the light emitting element.

Figure 16:
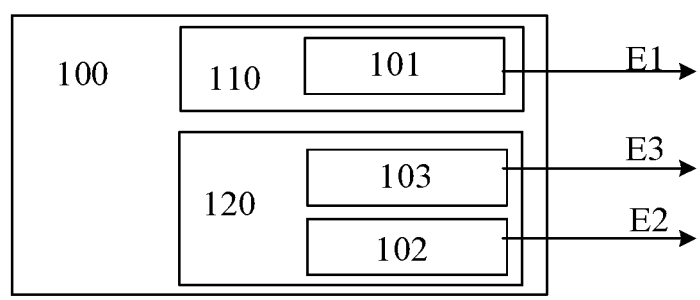
FIG. 16 is a schematic diagram showing another structure of an output control device according to an embodiment of the present disclosure.

In another embodiment, FIG. 16 is a schematic diagram showing another structure of the output control device according to an embodiment of the present disclosure. As shown in FIG. 16, the output control device 100 includes a scan control driving circuit 110 and a light emission control driving circuit 120. The light emission control driving circuit 120 includes a second output device 102 and a third output device 103. The scanning control driving circuit 110 includes a first output device 101. In this embodiment, a third output device is added to the light emission control driving circuit, and the output control device can simultaneously output two control signals with different frequencies. Furthermore, when the output control device is electrically connected to the pixel circuit, the data signal can be written at a low frequency, and the light emitting elements can be reset at a high frequency, avoiding the problem of display flicker in low-frequency operations. In addition, this embodiment only needs to add an output device to the light emission control circuit, and does not need to add any additional control driving circuit. When applied to a display panel, it has little impact on the bezel width of the display panel.

Figure 17:
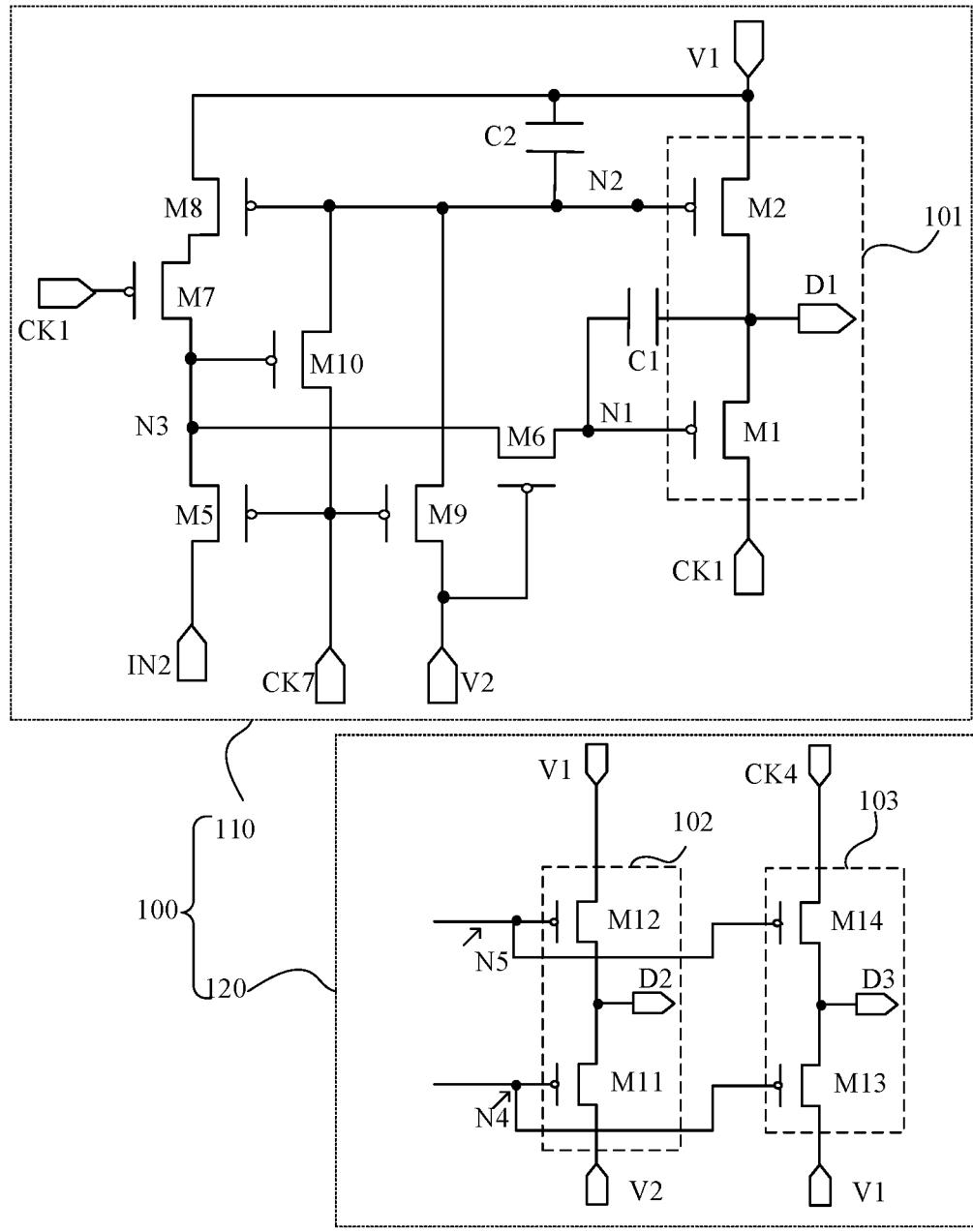
FIG. 17 is a schematic diagram showing another structure of an output control device according to an embodiment of the present disclosure.
Figure 18:
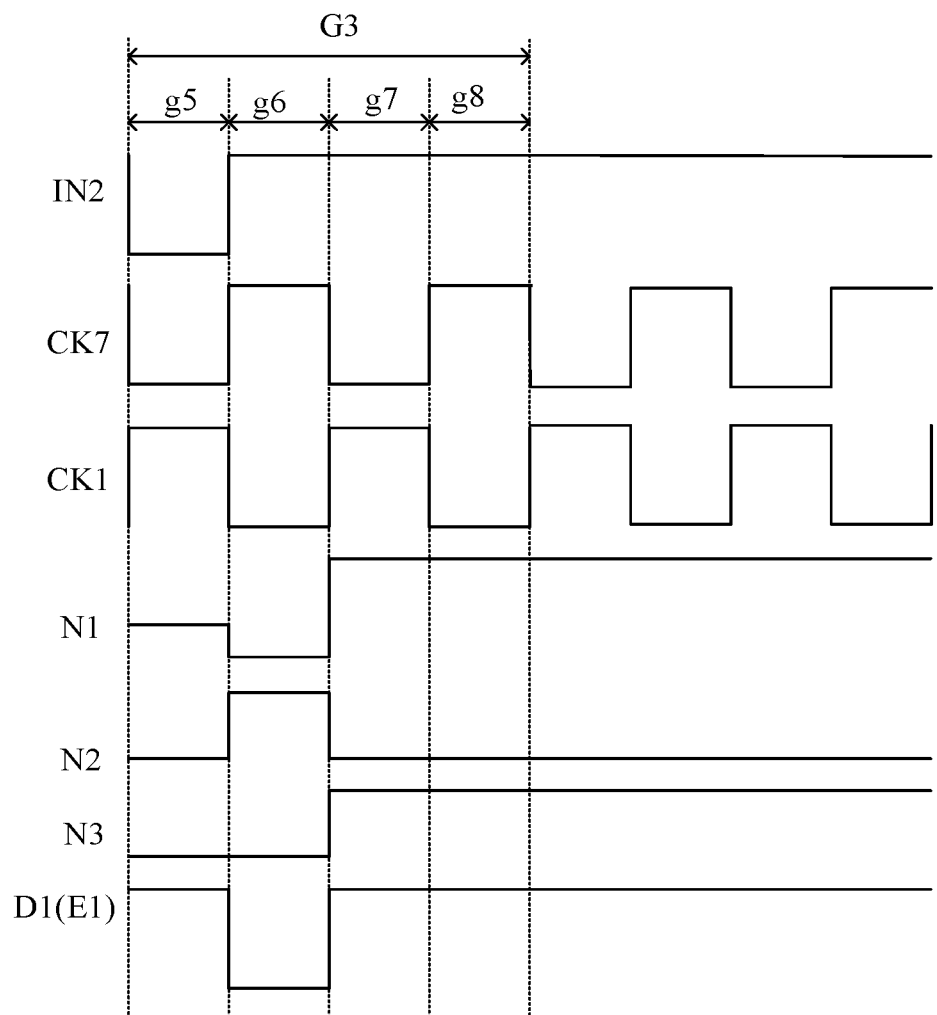
FIG. 18 is a timing sequence diagram of a scan control driving circuit according to an embodiment of the present disclosure.

In one embodiment, FIG. 17 is a schematic diagram showing another structure of an output control device provided by an embodiment of the present disclosure, and FIG. 18 is a timing sequence diagram of a scan control driving circuit in an embodiment of the present disclosure.

As shown in FIG. 17, the light emission control driving circuit 120 further includes a fourth node N4 and a fifth node N5. The second output device 102 is electrically connected to the fourth node N4 and the fifth node N5, respectively, and configured to output a second control signal E2 under control of a potential at the node N4 and a potential at the fifth node N5.

The third output device 103 is electrically connected to the fourth node N4 and the fifth node N5, respectively, and configured to output a third control signal E3 under control of the potential at the fourth node N4 and the potential at the fifth node N5. In this embodiment, the second output device 102 and the third output device 103 are both connected to the fourth node N4 and the fifth node N5, and the output device added to the light emission control driving circuit 120 is connected to the original circuit structure. Both output devices are controlled by the same node. Very little change is needed for the light emission control driving circuit, with a simple driving scheme. The figure also shows that the second output device 102 includes an eleventh transistor M11 and a twelfth transistor M12, and the third output device 103 includes a thirteenth transistor M13 and a fourteenth transistor M14. The specific control process of the second output device 102 and the third output device 103 by the potential at the fourth node N4 and the potential at the fifth node N5 will be described below.

In this embodiment, the light emission control driving circuit 12 includes a third output device 103 and a second output device 102. In the scan control driving circuit 110, the first output device 101 is configured to output the first control signal E1 for controlling writing of the data signal. The design of the scan control driving circuit 110 may not be changed, and the scan control driving circuit 110 may be any scan control driving circuit in the related art. The scan control driving circuit 110 in FIG. 17 is illustratively only. FIG. 17 shows that the scan control driving circuit 110 includes a first node N1 and a second node N2. The first output device 101 is electrically connected to the first node N1 and the second node N2, respectively, and the first output device 101 is configured to output the first control signal E2 under control of the potential at the first node N1 and the potential at the second node N2. FIG. 17 also shows a third node N3 in the scan control driving circuit 110. The scan control driving circuit 110 includes a first transistor M1, a second transistor M2, a fifth transistor M5 to a tenth transistor M10, a first capacitor C1 and a second capacitor C2. The scan control driving circuit 110 is controlled by the signal at the first clock signal terminal CK1, the signal at the seventh clock signal terminal CK7, the signal at the input terminal IN2, the signal at the first voltage signal terminal V1, and the signal at the second voltage signal terminal V2.

The first voltage signal terminal V1 provides a high-level signal, and the second voltage signal terminal V2 provides a low-level signal. As shown in the timing sequence diagram of FIG. 18, when the scan control driving circuit is driven to operate, the signal at the first clock signal terminal CK1 and the signal at the seventh clock signal terminal CK7 are opposite to each other. With the cooperation of the signals at the respective signal terminals, the first output device 101 outputs an active level signal once in an operation period G3 (taking a low-level signal as the active level signal as an example). One operation period of the scan control driving circuit 110 includes four phases.

In the first phase g5, the seventh clock signal terminal CK7 provides a low-level signal, and the first clock signal terminal CK1 provides a high-level signal, the fifth transistor M5 and the ninth transistor M9 are turned on, and the seventh transistor M7 is turned off. The fifth transistor M5 writes the low-level signal at the input terminal IN2 into the third node N3, the second voltage signal terminal V2 provides a low-level signal, and the sixth transistor M6 is on, the third node N3 provides the low-level signal to the first node N1. The ninth transistor M9 is turned on, the low-level signal at the second voltage signal terminal V2 is written into the second node N2. The second node N2 is at a low level, the eighth transistor M8 is turned on. At this time, the first clock signal terminal CK1 provides a high-level signal, and the seventh transistor M7 is turned off. In this phase, the first node N1 and the second node N2 are both at the low level. The output terminal D1 of the first output device 101 outputs the high-level signal at the first voltage signal terminal V1 and the high-level signal at the first clock signal terminal CK1.

In the second phase g6, the seventh clock signal terminal CK7 provides a high-level signal, and the first clock signal terminal CK1 provides a low-level signal. At this time, the fifth transistor M5 and the ninth transistor M9 are both turned off, and the seventh transistor is turned on. With the coupling effect of the first capacitor C1, the potential at the first node N1 continues to be pulled down. In this phase, the third node N3 maintains a low level, and the tenth transistor M10 is controlled to be turned on. The high-level signal at the seventh clock signal terminal CK7 is written into the second node N2, and the second node N2 controls the eighth transistor M8 to be turned off. In this phase, the first node N1 is at a low level, and the second node N2 is at a high level. Then, the output terminal D1 of the first output device 101 outputs the low-level signal at the first clock signal terminal CK1 (which is the first active level signal of the first control signal E1).

In the third phase g7, the seventh clock signal terminal CK7 provides a low-level signal, the second clock signal terminal CK2 provides a high-level signal, and the input terminal IN2 inputs a high-level signal. In this phase, a low potential is written into the second node N2 and the potential at the first node N1 is pulled up. At this time, the output signal of the output terminal of the scan control driving circuit is controlled by the second node N2. The output terminal D1 of the first output device 101 outputs the high-level signal at the first voltage signal terminal V1.

In the fourth phase g8, the second node N2 maintains a low potential, the first node N1 maintains a high potential, and the output terminal D1 of the first output device 101 outputs the high-level signal at the first voltage signal terminal V1.

The above describes the operation process of the scan control driving circuit. By adjusting the signal frequencies of the first clock signal terminal CK1 and the seventh clock signal terminal CK7, the signal frequency of the first control signal outputted by the first output device 101 can be controlled. Therefore, in cooperation with the light emission control driving circuit, the output control device can simultaneously output the first control signal and the third control signal, and the frequency of the third control signal is higher than the frequency of the first control signal.

Figure 19:
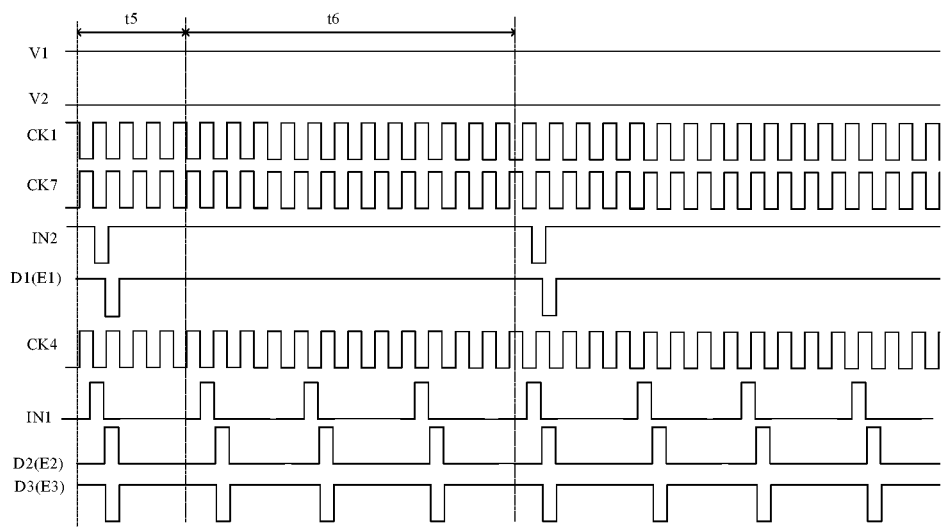
FIG. 19 is a timing sequence diagram of the output control device according to the embodiment of FIG. 17.

FIG. 19 is a timing sequence diagram of the output control device in the embodiment of FIG. 17. As shown in FIG. 19, in the light emission control driving circuit 120, by controlling the potential at the fourth node N4 and the potential at the fifth node N5, the second output device 102 can output the second control signal E2, and the third output device 103 can output the third control signal E3. In the first period, the second control signal E2 is the second active level signal, and the third control signal E3 is the third inactive level signal. In the second period, the second control signal E2 is the second inactive level signal, and the third control signal E3 is the third active level signal. Then, by designing the clock signal of the scan control driving circuit 110 and the signal at the input terminal, the scan control driving circuit 110 and the light emission control driving circuit 120 can cooperate and the first output device 101 of the scan control driving circuit 110 outputs the first control signal E1. Here, the frequency of the third control signal E3 is higher than the frequency of the first control signal E1. Thus, the output control device can provide three types of control signals for the pixel circuit: a first control signal for controlling writing of a data signal into the pixel circuit, a second control signal for controlling a light emitting element to emit light, and a third control signal for controlling resetting of the light emitting element. The light emitting element can be reset at a high frequency while the data signal can be written at a low frequency, solving the problem of display flickers in low frequency operations and ensuring resetting of the light emitting element at a high frequency, without affecting normal light emission of the light emitting element.

Reference is now made to FIG. 17, taken in conjunction with the timing sequence diagram in FIG. 19. As shown in FIG. 17, the second output device 102 is further electrically connected to the first voltage signal terminal V1 and the second voltage signal terminal V2, respectively, and configured to provide the signal at the second voltage signal terminal V2 to the output terminal D2 of the second output device 102 under control of the potential at the fourth node N4, and to provide the signal at the first voltage signal terminal V1 to the output terminal D2 of the second output device 102 under control of the potential at the fifth node N5 The third output device 103 is further electrically connected to the first voltage signal terminal V1 and the fourth clock signal terminal CK4, respectively, and configured to provide the signal at the first voltage signal terminal V1 to the output terminal D3 of the third output device 103 under control of the potential at the fourth node N4, and to provide the signal at the fourth clock signal terminal CK4 to the output terminal D3 of the third output device 103 under control of the potential at the fifth node N5.

That is, when the potential of the fourth node N4 is an active potential, the fourth node N4 simultaneously controls the output of the second output device 102 and the output of the third output device 103. When the potential of the fifth node N5 is an active potential, the fifth node N5 simultaneously controls the output of the second output device 102 and the output of the third output device 103. As shown in FIG. 19, the signal frequency of the input terminal IN2 of the scan control driving circuit 110 is lower than the signal frequency of the input terminal IN1 of the light emission control driving circuit 120, and the frequency of the first control signal E1 outputted by the first output device 101 is lower than the frequency of the third control signal E3 outputted by the third output device 103. The scanning control driving circuit and the light emission control driving circuit cooperate and the output control device can provide two control signals with different frequencies for the pixel circuit, to write the data signal at a low frequency and reset the light emitting element at a high frequency, avoiding the problem of display flickers in low-frequency operations.

When applied in low-frequency display, the time period t5 in the timing sequence diagram of FIG. 19 corresponds to the time period during which the display panel is controlled to display one frame of picture, and the time period t6 is the time period during which the display panel maintains the display of the previous frame of picture. In the time period t5, the first control signal E1 outputted by the output control device 100 includes the first active level signal, and the corresponding data signal can be written into the pixel circuit, and the light emitting element emits light for display. In the time period t6, the first control signal E1 outputted by the output control device 100 is the first inactive level signal, so no data signal is written into the pixel circuit and the light emitting element does not emit light. In the time period t5, the third control signal E3 includes the third active level signal, which can control the resetting of the light emitting element. In the time period t6, the third control signal E3 also includes the third active level signal, which can control the resetting of the light emitting element. That is, the embodiment of the present disclosure can allow writing the data signal at a low frequency while resetting the light emitting element at a high frequency.

Referring to FIG. 17 above, the second output device 102 includes an eleventh transistor M11 and a twelfth transistor M12. The gate of the eleventh transistor M11 is electrically connected to the fourth node N4, the first terminal of the eleventh transistor M11 is electrically connected to the second voltage signal terminal V2, and the second terminal of the eleventh transistor M11 is electrically connected to the output terminal D2 of the second output device 102. The gate of the twelfth transistor M12 is electrically connected to the fifth node N5, the first terminal of the twelfth transistor M12 is electrically connected to the first voltage signal terminal V1, and the second terminal of the twelfth transistor M12 is electrically connected to the output terminal D2 of the second output device 102.

The third output device 103 includes a thirteenth transistor M13 and a fourteenth transistor M14. The gate of the thirteenth transistor M13 is electrically connected to the fourth node N4, the first terminal of the thirteenth transistor M13 is connected to the first voltage signal terminal V1, and the second terminal of the thirteenth transistor M13 is electrically connected to the output terminal D3 of the third output device 103. The gate of the fourteenth transistor M14 is electrically connected to the fifth node, the first terminal of the fourteenth transistor M14 is electrically connected to the fourth clock signal terminal CK4, and the second terminal of the fourteenth transistor M14 is electrically connected to the output terminal D3 of the third output device 103.

In this embodiment, only two transistors and one clock signal terminal are added and the light emission control driving circuit outputs the second control signal and the third control signal simultaneously, and with a simple design. Furthermore, the output control device composed of the scan control driving circuit and the light emission control driving circuit can provide three types of control signals for the pixel circuit, to avoid the display flicker problem in low frequency display. When applied in a display panel, it does not require any additional driving circuit, which facilitates narrowing the bezel of the display panel.

Figure 20:
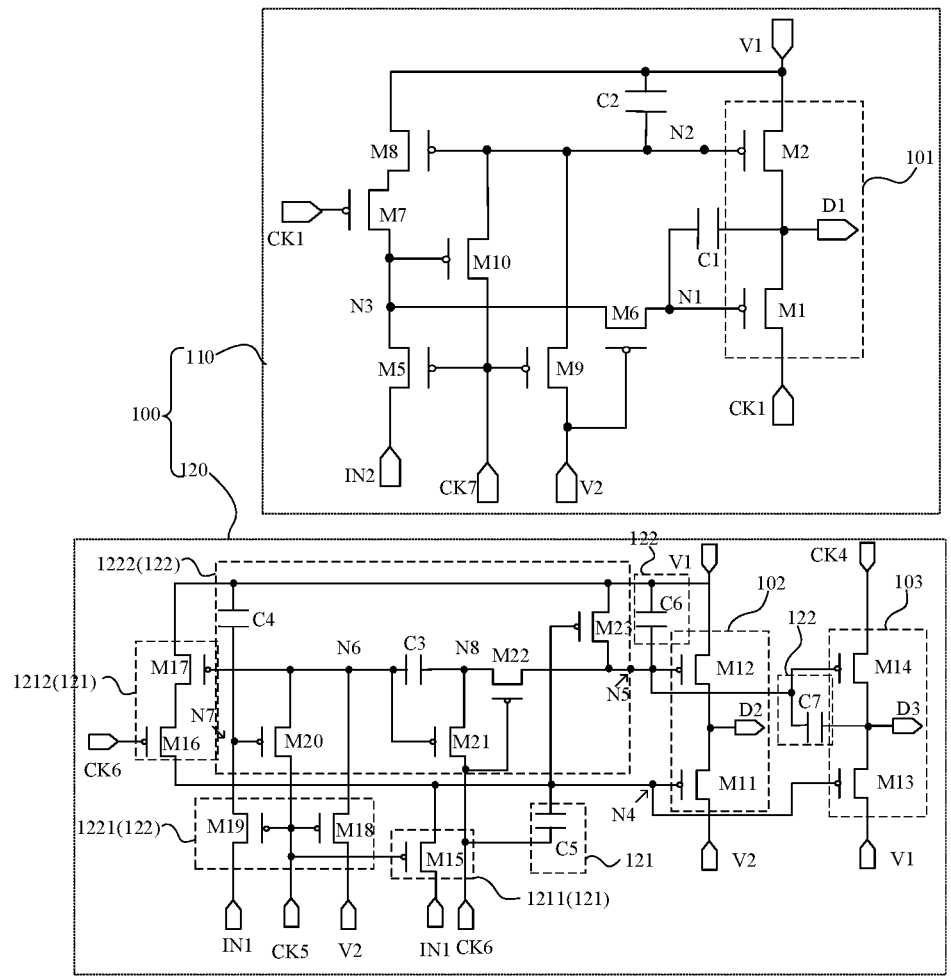
FIG. 20 is a schematic diagram showing another structure of an output control device according to an embodiment of the present disclosure.

In an embodiment, FIG. 20 is a schematic diagram showing another structure of an output control device according to an embodiment of the present disclosure. As shown in FIG. 20, the light emission control driving circuit 120 includes a fourth node control device 121 and a fifth node control device 122. The fourth node control device 121 is connected to an input terminal IN1 of the light emission control driving circuit 120, a fifth clock signal terminal CK5, a sixth clock signal terminal CK6 and a first voltage signal terminal V1, and is configured to control a level at a fourth node N4 according to the signal at the input terminal IN1 of the light emission control driving circuit 120, the signal at the fifth clock signal terminal CK5, the signal at the sixth clock signal terminal CK6, and the signal at the first voltage signal terminal V1. Here, the signal at the fifth clock signal terminal CK5 and the signal at the sixth clock signal terminal CK6 are opposite to each other. The fifth node control device 122 is electrically connected to the input terminal IN1 of the light emission control driving circuit 120, the fifth clock signal terminal CK5, the sixth clock signal terminal CK6, and a second voltage signal terminal V2, and is configured to control a level at a fifth node N5 according to the signal at the input terminal IN1 of the light emission control driving circuit 120, the signal at the fifth clock signal terminal CK5, the signal at the sixth clock signal terminal CK6, and the signal at the second voltage signal terminal V2. In this embodiment, for the specific circuit structure and operation process of the scan control circuit 110, reference may be made to the description in the embodiment in FIG. 17 described above, and the description thereof will be omitted here.

When applied in low-frequency display, the time period t3 in the timing sequence diagram 12 corresponds to the time period during which the display panel is controlled to display one frame of picture, and the time period t4 is the time period during which the display panel maintains the display of the previous frame of picture. In the time period t3, the first control signal E1 outputted by the output control device 100 includes the first active level signal, and the corresponding data signal is written into the pixel circuit, and the light emitting element emits light for display. In the time period t4, the first control signal E1 outputted by the output control device 100 is the first inactive level signal, so no data signal is written into the pixel circuit, and the light emitting element does not emit light.

Further, as shown in FIG. 20, the fourth node control device 121 includes a fourth input sub-device 1211 and a fourth protection sub-device 1212. The fourth input sub-device 1211 is configured to provide the signal at the input terminal IN1 of the light emission control driving circuit 120 to the fourth node N4 according to the signal at the fifth clock signal terminal CK5. The fourth protection sub-device 1212 is configured to control the level at the fourth node N4 according to the signal at the sixth clock signal terminal CK6 and the level at the sixth node N6. The fourth input sub-device is configured to write a voltage signal into the fourth node, and the fourth protection sub-device is configured to control the fourth node to be at a high level when the sixth node is at a low level and the sixth clock signal terminal provides a low-level active signal.

Further, referring to FIG. 20 again, the fourth input sub-device 1211 includes a fifteenth transistor M15. The gate of the fifteenth transistor M15 is electrically connected to the fifth clock signal terminal CK5, the first terminal of the fifteenth transistor M15 is electrically connected to the input terminal IN1 of the light emission control driving circuit 120, and the second terminal of the fifteenth transistor M15 is electrically connected to the fourth node N4. When the fifth clock signal terminal CK5 is an active level signal, the fifteenth transistor M15 is turned on, and the signal at the input terminal IN1 is provided to the fourth node N4 through the fifteenth transistor M15.

The fourth protection sub-device 1212 includes a sixteenth transistor M16 and a seventeenth transistor M17. The gate of the sixteenth transistor M16 is electrically connected to the sixth clock signal terminal CK6, the first terminal of the sixteenth transistor M16 is electrically connected to the second terminal of the seventeenth transistor M17, and the second terminal of the sixteenth transistor M16 is electrically connected to the fourth node N4. The gate of the seventeenth transistor M17 is electrically connected to the sixth node N6, the first terminal of the seventeenth transistor M17 is electrically connected to the first voltage signal terminal V1. When the sixth node N6 is at a low level and the sixth clock signal terminal CK6 provides an active low signal, the sixteenth transistor M16 and the seventeenth transistor M17 are both turned on, and the signal at the first voltage signal terminal V1 can be provided to the fourth node N4.

As shown in FIG. 20, the fifth node control device 122 includes a fifth input sub-device 1221 and a fifth control sub-device 1222. The fifth input sub-device 1221 is configured to provide the signal at the second voltage signal terminal V2 to the sixth node N6 according to the signal at the fifth clock signal terminal CK5, and to provide the signal at the input terminal IN1 of the light emission control driving circuit 120 to the seventh node N7 according to the signal at the fifth clock signal terminal CK5.

The fifth control sub-device 1222 is configured to provide the signal at the fifth clock signal terminal CK5 to the sixth node N6 under control of the level at the seventh node N7. The fifth control sub-device 1222 is further configured to provide the signal at the sixth clock signal terminal CK6 to the eighth node N8 under control of the level at the sixth node N6. The fifth control sub-device 1222 is further configured to provide the level at the eighth node N8 to the fifth node N5 under control of the signal at the sixth clock signal terminal CK6. The fifth control sub-device 1222 is also configured to provide the signal at the first voltage signal terminal V1 to the fifth node N5 under control of the level at the fourth node N4.

Further, referring to FIG. 20 again, the fifth input sub-device 1221 includes an eighteenth transistor M18 and a nineteenth transistor M19. The gate of the eighteenth transistor M18 is electrically connected to the fifth clock signal terminal CK5, the first terminal of the eighteenth transistor M18 is electrically connected to the second voltage signal terminal V2, and the second terminal of the eighteenth transistor M18 is electrically connected to the sixth node N6. The gate of the nineteenth transistor M19 is electrically connected to the fifth clock signal terminal CK5, the first terminal of the nineteenth transistor M19 is electrically connected to the input terminal IN1 of the light emission control driving circuit 120, and the second terminal of the nineteenth transistor M19 is electrically connected to the seventh node N7.

The fifth control sub-device 1222 includes a twentieth transistor M20, a twenty-first transistor M21, a twenty-second transistor M22, a twenty-third transistor M23, a third capacitor C3, and a fourth capacitor C4. The gate of the twentieth transistor M20 is electrically connected to the seventh node N7, the first terminal of the twentieth transistor M20 is electrically connected to the fifth clock signal terminal CK5, and the second terminal of the twentieth transistor M20 is electrically connected to the sixth node N6. The gate of the transistor M21 is electrically connected to the sixth node N6, the first terminal of the twenty-first transistor M21 is electrically connected to the sixth clock signal terminal CK6, and the second terminal of the twenty-first transistor M21 is electrically connected to the eighth node N8. The gate of the twenty-second transistor M22 is electrically connected to the sixth clock signal terminal CK6, the first terminal of the twenty-second transistor M22 is electrically connected to the eighth node N8, and the second terminal of the twenty-second transistor M22 is electrically connected to the fifth node N5. The gate of the twenty-third transistor M23 is electrically connected to the fourth node N4, the first terminal of the twenty-third transistor M23 is electrically connected to the first voltage signal terminal V1, and the second terminal of the twenty-third transistor M23 is electrically connected to the fifth node N5. An electrode of the third capacitor C3 is electrically connected to the sixth node N6, and another electrode of the third capacitor C3 is electrically connected to the eighth node N8. An electrode of the fourth capacitor C4 is electrically connected to the first voltage signal terminal V1, and another electrode of the fourth capacitor C4 is electrically connected to the seventh node N7. The fourth capacitor C4 is configured to maintain the potential at the seventh node N7.

Referring to FIG. 20 again, the fourth node control device 121 includes a fifth capacitor C5 having one electrode electrically connected to the fourth node N4 and another pole electrode electrically connected to the sixth clock signal terminal CK6. The fifth node control device 122 includes a sixth capacitor C6 and a seventh capacitor C7. An electrode of the sixth capacitor C6 is electrically connected to the fifth node N5, and another electrode of the sixth capacitor C6 is electrically connected to the first voltage signal terminal. An electrode of the seventh capacitor C7 is electrically connected to the fifth node N5, and another electrode of the seventh capacitor C7 is electrically connected to the output terminal D3 of the third output device 103.

Figure 21:
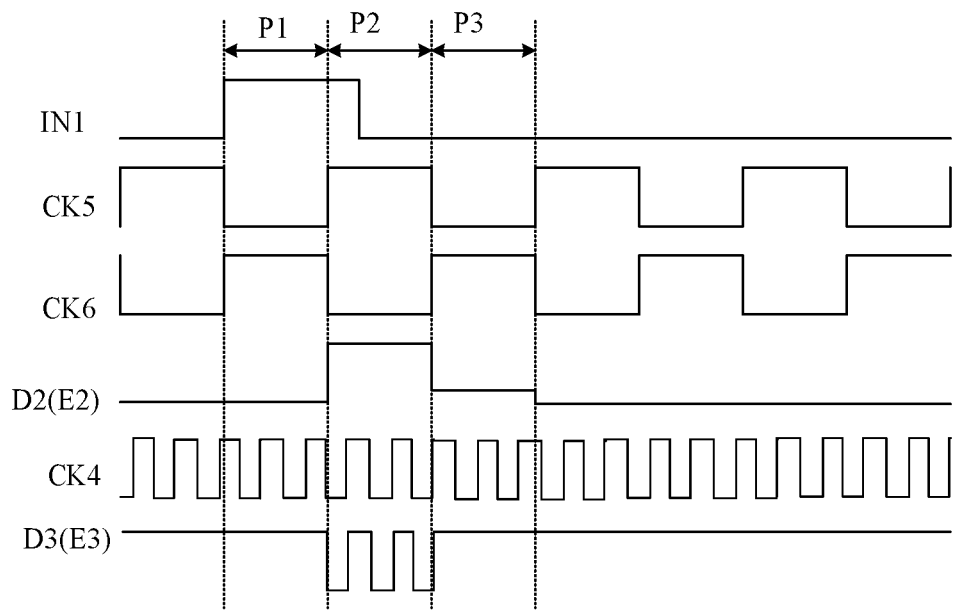
FIG. 21 is a timing sequence diagram of a light emission control driving circuit according to an embodiment of the present disclosure.

In an embodiment, the light emission control driving transistor in the output control device includes the eleventh transistor M11 to the twenty-second transistor M22, and the third capacitor C3 to the seventh capacitor C7 as described above. Reference can be made to the circuit structure illustrated in FIG. 20 and the timing sequence diagram illustrated in FIG. 21. It is assumed that the first voltage signal terminal V1 is at a high level and the second voltage signal terminal V2 is at a low level signal as an example. FIG. 21 is a timing sequence diagram of a light emission control driving circuit according to an embodiment of the present disclosure.

At time P1, the fifth clock signal terminal CK5 provides an active level signal, the sixth clock signal terminal CK6 provides an inactive level signal, and the input terminal IN1 provides a high-level signal. At this time, the fourth node N4, the sixth node N6, the eighth node N8 and the seventh node N7 are reset. Here, the fourth node N4 is at a high-level potential, the seventh node N7 is at a high-level potential, the sixth node N6 is at a low-level potential, the eighth node N8 is at a high-level potential, and the fifth node N5 is at a high level potential. The eleventh transistor M11 and the twelfth transistor M12 in the second output device 102 are both off. The thirteenth transistor M13 and the fourteenth transistor M14 in the third output device 103 are also off. At time P2, the fifth clock signal terminal CK5 provides an inactive level signal, the sixth clock signal terminal CK6 provides an active level signal, and the input terminal IN1 provides a low-level signal. At this time, the fourth node N4 is at a high-level potential, the fifth node N5 is pulled down, the output terminal D2 of the second output device 102 outputs the high-level signal at the first voltage signal terminal V1, and the output terminal D3 of the third output device 103 outputs the signal provided by the fourth clock signal terminal CK4. At time P3, the fifth clock signal terminal CK5 provides an active level signal, the sixth clock signal terminal CK6 provides an inactive level signal, and the input terminal IN1 provides a low-level signal. At time P3, a low-level signal is written into the seventh node N7 and the seventh node N7 maintains a low potential. The sixth node N6 is at a low potential. The fourth node N4 is at a low potential and maintains a low potential. The fourth node N4 maintains a low potential, then the fifth node N5 is controlled to maintain a high potential. Therefore, the output terminal D2 of the second output device 102 outputs the low-level signal at the second voltage signal terminal V2, and the output terminal D3 of the third output device 103 outputs the high-level signal at the first voltage signal terminal V1. Taking the low-level signal outputted from the output terminal as an active level signal and the high-level signal as an inactive level signal as an example, the embodiment can be implemented and, in the first period, the second control signal is the second active level signal, the third control signal is the third inactive level signal. In the second time period, the second control signal is the second inactive level signal, and the third control signal is the third active level signal.

It should be noted that in the above timing sequence diagram, the waveforms of the signal at the fourth clock signal terminal CK4 and the signal at the fifth clock signal terminal CK5 are illustrative only, and the present disclosure is not limited thereto.

Figure 22:
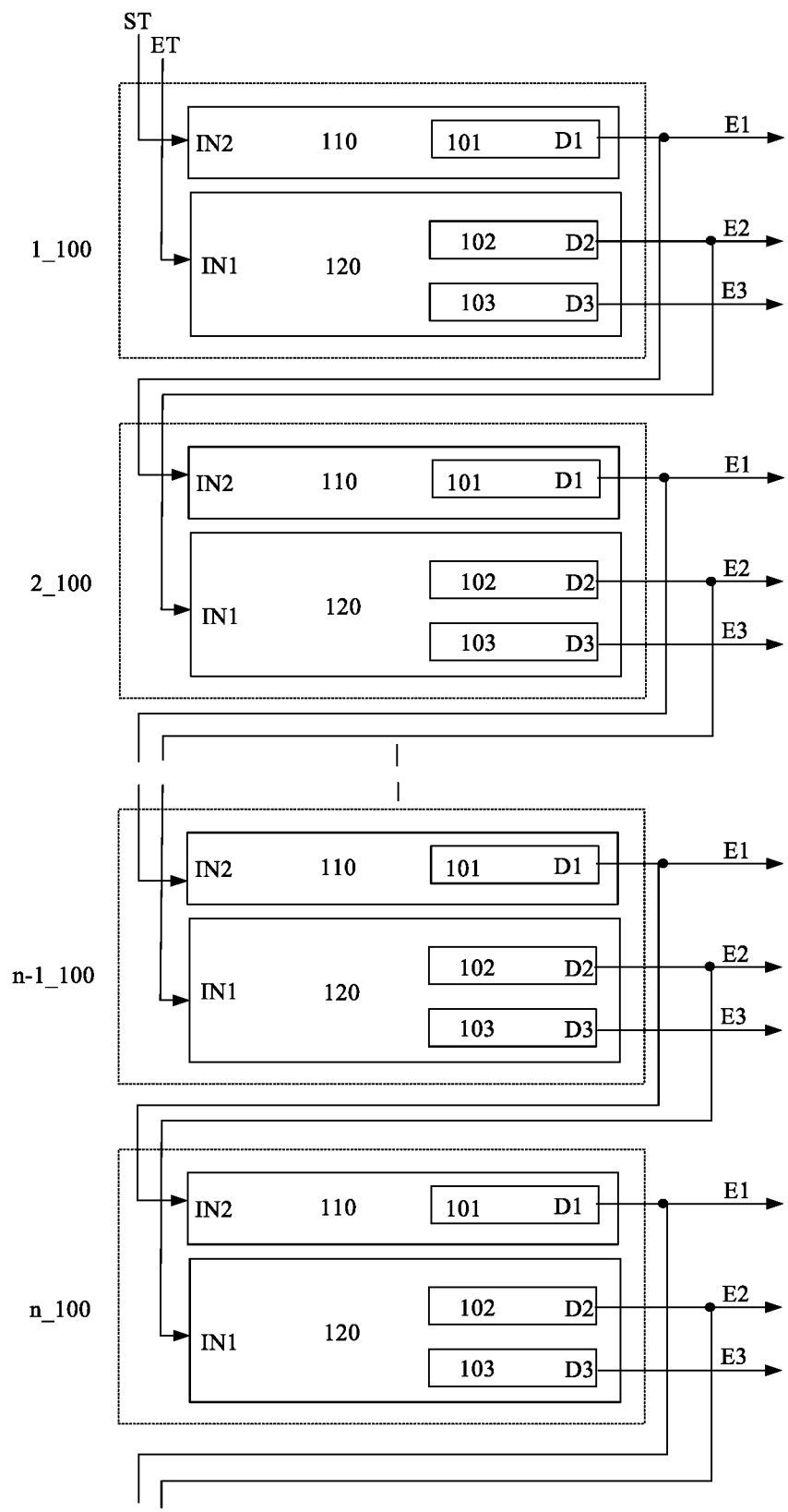
FIG. 22 is a block diagram of an output control circuit according to an embodiment of the present disclosure.

Further, an embodiment of the present disclosure also provides an output control circuit, including a plurality of stages of output control devices each according to any of the embodiments in FIGS. 16 to 21. FIG. 22 is a block diagram of an output control circuit according to an embodiment of the present disclosure.

As shown in FIG. 22, the input terminal IN2 of the scan control driving circuit 110 in the output control device 1_100 at the first stage inputs a start scan shift signal ST, and the input terminal IN1 of the light emission control driving circuit 120 in the output control device at the first stage 1_100 inputs a start light emission shift signal ET.

The input terminal IN2 of the scan control driving circuit 110 in the output control device at the second stage 2_100 is electrically connected to the output terminal D1 of the first output device 101 of the scan control driving circuit 110 in the output control device at the first stage 1_100. The input terminal IN1 of the light emission control driving circuit 120 in the output control device at the second stage 2_100 is electrically connected to the output terminal D2 of the second output device 102 of the light emission control driving circuit 120 in the output control device at the first stage 1_100.

The input terminal IN2 of the scan control driving circuit 110 in the output control device at the n-th stage n_100 is electrically connected to the output terminal D1 of the first output device 101 of the scan control driving circuit 110 in the output control device at the (n−1)-th stage n−1_100, The input terminal IN1 of the light emission control driving circuit 120 in the output control device at the n-th stage n_100 is electrically connected to the output terminal D2 of the second output device 102 of the light emission control driving circuit 120 in the output control device at the (n−1)-th stage n−1_100, where n is a positive integer, and n≥2.

In this embodiment, the scan control driving circuits are arranged in a cascaded manner, and the light emission control driving circuits are arranged in a cascaded manner. Here, for the light emission control driving circuit, the signal at the fourth clock signal terminal, the signal at the fifth clock signal terminal, and the signal at the sixth clock signal terminal are required for driving the light emission control driving circuit at each stage. Here, the signal at the fifth clock signal terminal and the signal at the sixth clock signal terminal are opposite to each other. Here, the fourth clock signal terminal is provided and the third output device of the light emission control driving circuit can output the third control signal. In this embodiment, the light emission control driving circuit at each stage needs a clock signal provided by the fourth clock control terminal, so an additional clock signal is needed in this embodiment and the light emission control driving circuit can output the second control signal and the third control signal. In one embodiment of the present disclosure only includes a set of cascaded scan control driving circuits and a set of cascaded light emission control driving circuits.

Figure 23:
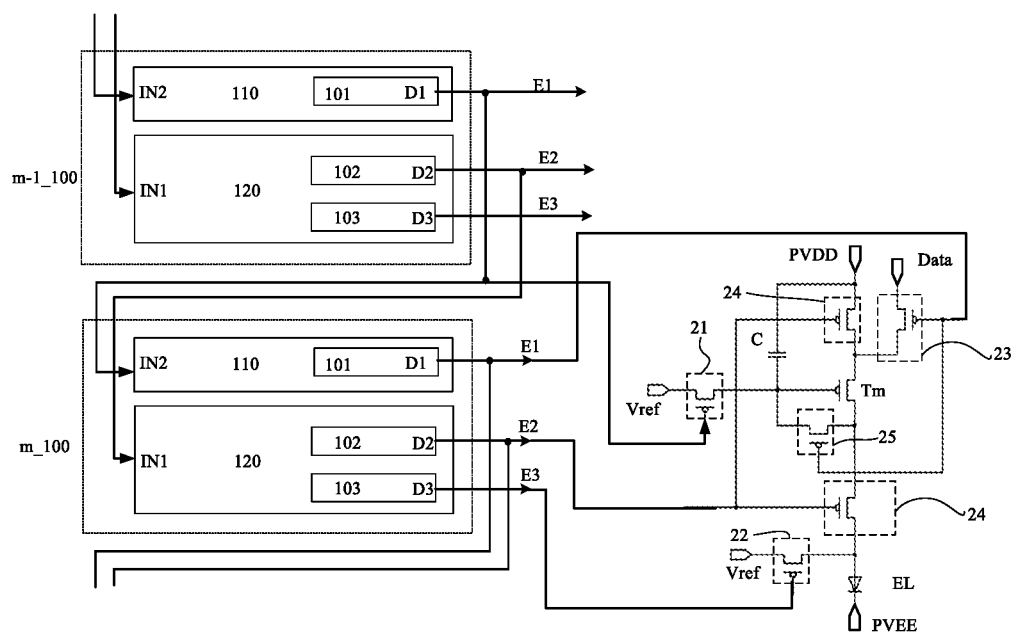
FIG. 23 is a schematic diagram showing a circuit structure in a display panel according to an embodiment of the present disclosure.

Further, an embodiment of the present disclosure also provides a display panel, which includes the output control circuit in the embodiment of FIG. 22 as described above. The display panel further includes a plurality of pixel circuits arranged in an array. Each pixel circuit includes a first resetting device, a second resetting device, a data writing device, a light emission control device, a driving transistor, and a light emitting element. The first resetting device is configured to reset the gate of the driving transistor. The second resetting device is configured to reset the light emitting element. The data writing device is configured to write a data signal. The light emission control device is configured to control the light emitting element to emit light. The output control device at each stage in the display panel can drive a plurality of pixel circuits in one row at the same time, or the output control device at each stage can drive a plurality of pixel circuits in two or more rows at the same time. The following only illustrates a connection scheme of the pixel circuit and the output control device. FIG. 23 is a schematic diagram showing a circuit structure in a display panel according to an embodiment of the present disclosure. As shown in FIG. 23, the structure of the pixel circuit in FIG. 23 is illustrative only. For the structure of the pixel circuit and the operation process of the pixel circuit, reference may be made to the description of the corresponding embodiment in FIG. 4, and the description thereof will be omitted here. In one pixel circuit:

a control terminal of the first resetting device 21 is electrically connected to the first output device 101 of the scan control driving circuit 110 in the output control device at the (m−1)-th stage m−1_100, where m is a positive integer and m≥2;

a control terminal of the second resetting device 22 is electrically connected to the third output device 103 of the light emission control driving circuit 120 in the output control device at the m-th stage m_100;

a control terminal of the data writing device 23 is electrically connected to the first output device 101 of the scan control driving circuit 110 in the output control device at the m-th stage m_100; and a control terminal of the light emission control device 24 is electrically connected to the second output device 102 of the light emission control driving circuit 120 in the output control device at the m-th stage m_100.

With the above connection method, the first control signal outputted by the first output terminal in the output control device controls data writing, the control signal outputted by the second output terminal controls the light emitting element to emit light, and the third control signal outputted by the third output terminal controls resetting of the anode of the light emitting element. Here, the signal frequency of the third control signal is higher than the signal frequency of the first control signal. In the first period, the second control signal is the second active level signal, and the third control signal is the third inactive level signal. In the second period, the second control signal is the second inactive level signal, and the third control signal is the third active level signal. The data signal can be written at a low frequency while the light emitting element can be reset at a high frequency, to avoid the problem of di splay flicker in low-frequency operations. At the same time, the second control signal and the third control signal cooperate and the light emitting element can be reset when the light emission control device in the pixel circuit is off, and the light emitting element is not reset when the light emission control device is on, ensuring that the light emitting element can be reset at a high frequency, without affecting normal light emission of the light emitting element.

The embodiment of the present disclosure also provides a display device. The display device includes the display panel according to any embodiment of the present disclosure. The display device in the embodiment of the present disclosure may be any device with a display function, such as a mobile phone, a tablet computer, a notebook computer, an electronic paper book, a television, and a smart watch.

The above descriptions are only some embodiments of the present disclosure and are not intended to limit the present disclosure. Any modifications, equivalent alternatives, or improvements that are made without departing from the spirits and principles of the present disclosure should be encompassed by the scope of the present disclosure.

What is claimed is:

1. An output control device for providing control signals for a pixel circuit, the output control device comprising:
   a first output device configured to output a first control signal for controlling writing of a data signal into the pixel circuit, and
   a third output device configured to output a third control signal for controlling resetting of a light emitting element,
   wherein a frequency of the third control signal is higher than a frequency of the first control signal.

2. The output control device according to claim 1, further comprising:
   a second output device configured to output a second control signal for controlling the light emitting element to emit light.

3. The output control device according to claim 2, wherein:
   the output control device comprises a scan control driving circuit and a light emission control driving circuit, wherein
   the scan control driving circuit comprises the first output device and the third output device, and the light emission control driving circuit comprises the second output device.

4. The output control device according to claim 3, wherein
   the scan control driving circuit further comprises a first node and a second node,
   the first output device is electrically connected to the first node and the second node, respectively, and the first output device is configured to output the first control signal under control of a potential at the first node and a potential at the second node, and
   the third output device is electrically connected to the first node and the second node, respectively, and the third output device is configured to output the third control signal under control of the potential at the first node and the potential at the second node.

5. The output control device according to claim 4, wherein
   the first output device is further electrically connected to a first voltage signal terminal and a first clock signal terminal, and the first output device is configured to provide a signal at the first clock signal terminal to an output terminal of the first output device under control of the potential at the first node, and to provide a signal at the first voltage signal terminal to the output terminal of the first output device under control of the potential at the second node, and the third output device is further electrically connected to the first voltage signal terminal and a second clock signal terminal, and the third output device is configured to provide a signal at the second clock signal terminal to an output terminal of the third output device under control of the potential at the first node, and to provide the signal at the first voltage signal terminal to the output terminal of the third output device under control of the potential at the second node, and wherein a signal frequency of the second clock signal terminal is higher than a signal frequency of the first clock signal terminal.

6. The output control device according to claim 5, wherein the first output device comprises a first transistor and a second transistor, a gate of the first transistor is electrically connected to the first node, a first terminal of the first transistor is electrically connected to the first clock signal terminal, and a second terminal of the first transistor is electrically connected to the output terminal of the first output device, a gate of the second transistor is electrically connected to the second node, a first terminal of the second transistor is electrically connected to the first voltage signal terminal, and a second terminal of the second transistor is electrically connected to the output terminal of the first output device, and the third output device comprises a third transistor and a fourth transistor, a gate of the third transistor is electrically connected to the first node, a first terminal of the third transistor is electrically connected to the second clock signal terminal, and a second terminal of the third transistor is electrically connected to the output terminal of the third output device, and a gate of the fourth transistor is electrically connected to the second node, a first terminal of the fourth transistor is electrically connected to the first voltage signal terminal, and a second terminal of the fourth transistor is electrically connected to the output terminal of the third output device.

7. An output control circuit, comprising a plurality of stages of output control devices each according to claim 3, wherein a start scan shift signal is inputted at an input terminal of the scan control driving circuit in the output control device at the first stage, and a start light emission shift signal is inputted at an input terminal of the light emission control driving circuit in the output control device at the first stage, and the input terminal of the scan control driving circuit in the output control device at the n-th stage is electrically connected to the output terminal of the third output device of the scan control driving circuit in the output control device at the (n−1)-th stage, and the input terminal of the light emission control driving circuit in the output control device at the n-th stage is electrically connected to the output terminal of the second output device of the light emission control driving circuit in the output control device at the (n−1)-th stage, where n is a positive integer and n≥2.

8. The output control circuit according to claim 7, wherein the scan control driving circuit further comprises a first node and a second node, the first output device is electrically connected to the first node and the second node, respectively, and the first output device is configured to output the first control signal under control of a potential at the first node and a potential at the second node, and the third output device is electrically connected to the first node and the second node, respectively, and the third output device is configured to output the third control signal under control of the potential at the first node and the potential at the second node.

9. The output control circuit according to claim 8, wherein the first output device is further electrically connected to a first voltage signal terminal and a first clock signal terminal, and the first output device is configured to provide a signal at the first clock signal terminal to an output terminal of the first output device under control of the potential at the first node, and to provide a signal at the first voltage signal terminal to the output terminal of the first output device under control of the potential at the second node, and the third output device is further electrically connected to the first voltage signal terminal and a second clock signal terminal, and the third output device is configured to provide a signal at the second clock signal terminal to an output terminal of the third output device under control of the potential at the first node, and to provide the signal at the first voltage signal terminal to the output terminal of the third output device under control of the potential at the second node, and wherein a signal frequency of the second clock signal terminal is higher than a signal frequency of the first clock signal terminal.

10. The output control circuit according to claim 9, wherein the first output device comprises a first transistor and a second transistor, a gate of the first transistor is electrically connected to the first node, a first terminal of the first transistor is electrically connected to the first clock signal terminal, and a second terminal of the first transistor is electrically connected to the output terminal of the first output device, a gate of the second transistor is electrically connected to the second node, a first terminal of the second transistor is electrically connected to the first voltage signal terminal, and a second terminal of the second transistor is electrically connected to the output terminal of the first output device, and the third output device comprises a third transistor and a fourth transistor, a gate of the third transistor is electrically connected to the first node, a first terminal of the third transistor is electrically connected to the second clock signal terminal, and a second terminal of the third transistor is electrically connected to the output terminal of the third output device, and a gate of the fourth transistor is electrically connected to the second node, a first terminal of the fourth transistor is electrically connected to the first voltage signal terminal, and a second terminal of the fourth transistor is electrically connected to the output terminal of the third output device.

11. A display panel, comprising:

the output control circuit according to claim 7; and a plurality of pixel circuits arranged in an array, each pixel circuit comprising a first resetting device, a second resetting device, a data writing device, a light emission control device, a driving transistor, and a light emitting element, wherein the first resetting device is configured to reset a gate of the driving transistor, the second resetting device is configured to reset the light emitting element, the data writing device is configured to write a data signal, and the light emission control device is configured to control the light emitting element to emit light, and wherein in one of the plurality of pixel circuits:

a control terminal of the first resetting device is electrically connected to the third output device of the scan control driving circuit in the output control device at the (m−1)-th stage, where m is a positive integer, and m≥2, a control terminal of the second resetting device is electrically connected to the third output device of the scan control driving circuit in the output control device at the m-th stage, a control terminal of the data writing device is electrically connected to the first output device of the scan control driving circuit in the output control device at the m-th stage, and a control terminal of the light emission control device is electrically connected to the second output device of the light emission control driving circuit in the output control device at the m-th stage.

12. A display device, comprising the display panel according to claim 11.

13. The output control device according to claim 2, wherein:

the output control device comprises a scan control driving circuit and a light emission control driving circuit, the light emission control driving circuit comprises the second output device and the third output device, and the scan control driving circuit comprises the first output device.

14. The output control device according to claim 13, wherein the light emission control driving circuit further comprises a fourth node and a fifth node, the second output device is electrically connected to the fourth node and the fifth node, respectively, and the second output device is configured to output the second control signal under control of a potential at the fourth node and a potential at the fifth node, and the third output device is electrically connected to the fourth node and the fifth node, respectively, and the third output device is configured to output the third control signal under control of the potential at the fourth node and the potential at the fifth node.

15. The output control device according to claim 14, wherein the second output device is further electrically connected to a first voltage signal terminal and a second voltage signal terminal, and the second output device is configured to provide a signal at the second voltage signal terminal to an output terminal of the second output device under control of the potential at the fourth node, and to provide a signal at the first voltage signal terminal to the output terminal of the second output device under control of the potential at the fifth node, and the third output device is further electrically connected to the first voltage signal terminal and a fourth clock signal terminal, and the third output device is configured to provide the signal at the first voltage signal terminal to an output terminal of the third output device under control of the potential at the fourth node, and to provide a signal at the fourth clock signal terminal to output terminal of the third output device under control of the potential at the fifth node.

16. The output control device according to claim 15, wherein the second output device comprises an eleventh transistor and a twelfth transistor;

a gate of the eleventh transistor is electrically connected to the fourth node, a first terminal of the eleventh transistor is electrically connected to the second voltage signal terminal, and a second terminal of the eleventh transistor is electrically connected to the output terminal of the second output device, a gate of the twelfth transistor is electrically connected to the fifth node, a first terminal of the twelfth transistor is electrically connected to the first voltage signal terminal, and a second terminal of the twelfth transistor is electrically connected to the output terminal of the second output device, and the third output device comprises a thirteenth transistor and a fourteenth transistor, a gate of the thirteenth transistor is electrically connected to the fourth node, a first terminal of the thirteenth transistor is electrically connected to the first voltage signal terminal, and a second terminal of the thirteenth transistor is electrically connected to the output terminal of the third output device, and a gate of the fourteenth transistor is electrically connected to the fifth node, a first terminal of the fourteenth transistor is electrically connected to the fourth clock signal terminal, and a second terminal of the fourteenth transistor is electrically connected to the output terminal of the third output device.

17. An output control circuit, comprising a plurality of stages of output control devices each according claim 13, wherein a start scan shift signal is inputted at an input terminal of the scan control driving circuit in the output control device at the first stage, and a start light emission shift signal is inputted at an input terminal of the light emission control driving circuit in the output control device at the first stage, and the input terminal of the scan control driving circuit in the output control device at the n-th stage is electrically connected to an output terminal of the first output device of the scan control driving circuit in the output control device at the (n−1)-th stage, and the input terminal of the light emission control driving circuit in the output control device at the n-th stage is electrically connected to the output terminal of the second output device of the light emission control driving circuit in the output control device at the (n−1)-th stage, where n is a positive integer and n≥2.

18. The output control circuit according to claim 17, wherein the light emission control driving circuit further comprises a fourth node and a fifth node, the second output device is electrically connected to the fourth node and the fifth node, respectively, and the second output device is configured to output the second control signal under control of a potential at the fourth node and a potential at the fifth node, and the third output device is electrically connected to the fourth node and the fifth node, respectively, and the third output device is configured to output the third control signal under control of the potential at the fourth node and the potential at the fifth node.

19. The output control circuit according to claim 18, wherein the second output device is further electrically connected to a first voltage signal terminal and a second voltage signal terminal, and the second output device is configured to provide a signal at the second voltage signal terminal to an output terminal of the second output device under control of the potential at the fourth node, and to provide a signal at the first voltage signal terminal to the output terminal of the second output device under control of the potential at the fifth node, and the third output device is further electrically connected to the first voltage signal terminal and a fourth clock signal terminal, and the third output device is configured to provide the signal at the first voltage signal terminal to an output terminal of the third output device under control of the potential at the fourth node, and to provide a signal at the fourth clock signal terminal to output terminal of the third output device under control of the potential at the fifth node.

20. The output control circuit according to claim 19, wherein the second output device comprises an eleventh transistor and a twelfth transistor;

a gate of the eleventh transistor is electrically connected to the fourth node, a first terminal of the eleventh transistor is electrically connected to the second voltage signal terminal, and a second terminal of the eleventh transistor is electrically connected to the output terminal of the second output device, a gate of the twelfth transistor is electrically connected to the fifth node, a first terminal of the twelfth transistor is electrically connected to the first voltage signal terminal, and a second terminal of the twelfth transistor is electrically connected to the output terminal of the second output device, and the third output device comprises a thirteenth transistor and a fourteenth transistor, a gate of the thirteenth transistor is electrically connected to the fourth node, a first terminal of the thirteenth transistor is electrically connected to the first voltage signal terminal, and a second terminal of the thirteenth transistor is electrically connected to the output terminal of the third output device, and a gate of the fourteenth transistor is electrically connected to the fifth node, a first terminal of the fourteenth transistor is electrically connected to the fourth clock signal terminal, and a second terminal of the fourteenth transistor is electrically connected to the output terminal of the third output device.

21. A display panel, comprising:

the output control circuit according to claim 17; and a plurality of pixel circuits arranged in an array, each pixel circuit comprising a first resetting device, a second resetting device, a data writing device, a light emission control device, a driving transistor, and a light emitting element, wherein the first resetting device is configured to reset a gate of the driving transistor, the second resetting device is configured to reset the light emitting element, the data writing device is configured to write a data signal, and the light emission control device is configured to control the light emitting element to emit light, and wherein in one of the pixel circuits:

a control terminal of the first resetting device is electrically connected to the first output device of the scan control driving circuit in the output control device at the (m−1)-th stage, where m is a positive integer, and m≥2, a control terminal of the second resetting device is electrically connected to the third output device of the light emission control driving circuit in the output control device at the m-th stage, a control terminal of the data writing device is electrically connected to the first output device of the scan control driving circuit in the output control device at the m-th stage, and a control terminal of the light emission control device is electrically connected to the second output device of the light emission control driving circuit in the output control device at the m-th stage.

22. A display device, comprising the display panel according to claim 21.

* * * * *